US007943863B2

(12) United States Patent
Nakamura

(10) Patent No.: US 7,943,863 B2
(45) Date of Patent: May 17, 2011

(54) WIRING SUBSTRATE AND MANUFACTURING METHOD THEREOF, AND SEMICONDUCTOR DEVICE

(75) Inventor: Junichi Nakamura, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 74 days.

(21) Appl. No.: 11/882,198

(22) Filed: Jul. 31, 2007

(65) Prior Publication Data
US 2008/0029297 A1    Feb. 7, 2008

(30) Foreign Application Priority Data

Aug. 1, 2006    (JP) .............................. P.2006-209845

(51) Int. Cl.
*H05K 1/11*    (2006.01)
(52) U.S. Cl. ........ 174/264; 174/255; 174/257; 174/258; 174/260; 361/792; 361/793; 361/795; 257/682; 257/684; 257/686; 257/723; 29/832
(58) Field of Classification Search .................. 174/264, 174/255–258, 260; 361/792, 793, 795; 257/682, 257/684, 686, 723; 29/832
See application file for complete search history.

(56) References Cited

U.S. PATENT DOCUMENTS

| 5,920,126 | A | 7/1999 | Sohara |
| 6,049,122 | A | 4/2000 | Yoneda |
| 6,242,279 | B1 | 6/2001 | Ho et al. |
| 6,280,595 | B1 * | 8/2001 | Montgomery ................. 205/122 |
| 6,338,195 | B1 * | 1/2002 | Tsukagoshi et al. ............. 29/832 |
| 6,346,678 | B1 * | 2/2002 | Kono et al. .................... 174/255 |
| 6,370,013 | B1 * | 4/2002 | Iino et al. .................... 361/306.3 |
| 6,489,685 | B2 * | 12/2002 | Asahi et al. .................... 257/774 |
| 0,074,088 | A1 | 4/2004 | Nakamura et al. |
| 6,862,189 | B2 * | 3/2005 | Higuchi .......................... 361/767 |
| 6,936,336 | B2 * | 8/2005 | Matsunaga et al. ........... 428/209 |
| 6,949,815 | B2 * | 9/2005 | Yamazaki et al. ............. 257/682 |
| 7,078,269 | B2 * | 7/2006 | Yamasaki et al. ............. 438/121 |
| 7,132,608 | B2 * | 11/2006 | Endoh et al. .................. 174/255 |
| 7,134,195 | B2 * | 11/2006 | Sunohara et al. ................ 29/832 |
| 7,135,378 | B2 * | 11/2006 | Takaoka et al. ............... 438/401 |
| 7,189,593 | B2 * | 3/2007 | Lee ................................. 438/107 |
| 7,221,048 | B2 * | 5/2007 | Daeche et al. ................ 257/690 |
| 7,247,508 | B2 * | 7/2007 | Higashitani et al. ............. 438/17 |
| 7,271,476 | B2 * | 9/2007 | Nishikawa et al. ........... 257/684 |
| 7,335,531 | B2 * | 2/2008 | Iijima et al. .................... 438/106 |
| 2004/0040742 | A1 | 3/2004 | Ishizaki |
| 2004/0115862 | A1 | 6/2004 | Kung et al. |
| 2005/0161587 | A1 * | 7/2005 | Mihara et al. ............. 250/214 R |
| 2006/0012048 | A1 * | 1/2006 | Murai et al. .................. 257/758 |

(Continued)

FOREIGN PATENT DOCUMENTS

EP    0 543 411    5/1993

(Continued)

*Primary Examiner* — Tuan T. Dinh
*Assistant Examiner* — Xiaoliang Chen
(74) *Attorney, Agent, or Firm* — Drinker Biddle & Reath LLP

(57) ABSTRACT

A wiring substrate includes a first insulation layer, a connection terminal, a second insulation layer, a via, and a wiring pattern. The connection terminal is disposed in the first insulation layer so as to be exposed from a first main surface of the first insulation layer, and is electrically connected with a semiconductor chip. The second insulation layer is disposed on a second main surface of the first insulation layer situated on the opposite side from the first main surface. The via is disposed in the second insulation layer, and is electrically connected with the connection terminal. The via is separated from the connection terminal. The wiring pattern is disposed on the second main surface of the first insulation layer and electrically connects the connection terminal and the via.

9 Claims, 27 Drawing Sheets

U.S. PATENT DOCUMENTS

| | | | |
|---|---|---|---|
| 2006/0046350 A1 | 3/2006 | Jiang et al. | |
| 2006/0267186 A1* | 11/2006 | Tanida et al. | 257/723 |
| 2007/0141800 A1* | 6/2007 | Kurihara et al. | 438/396 |
| 2007/0194456 A1* | 8/2007 | Cohn | 257/778 |
| 2007/0284735 A1* | 12/2007 | Tanida et al. | 257/731 |

FOREIGN PATENT DOCUMENTS

| | | |
|---|---|---|
| EP | 1 091 406 | 4/2001 |
| JP | 2001-284783 | 10/2001 |
| JP | 2002-368155 | 12/2002 |
| JP | 2005-333006 | 12/2005 |

* cited by examiner

WIRING SUBSTRATE AND MANUFACTURING METHOD THEREOF, AND SEMICONDUCTOR DEVICE

This application claims priority to Japanese Patent Application No. 2006-209845, filed Aug. 1, 2006, in the Japanese Patent Office. The priority application is incorporated by reference in its entirety.

TECHNICAL FIELD

The present disclosure relates to a wiring substrate and a manufacturing method thereof, and a semiconductor device. More particularly, it relates to a wiring substrate including a connection terminal to be connected with a semiconductor chip, and a manufacturing method thereof, and a semiconductor device.

RELATED ART

The mounting pitch of connection terminals to be disposed on a wiring substrate has been narrowed (which is hereinafter referred to as "narrowing of pitch") due to recent miniaturization of a semiconductor chip. As the semiconductor device including a wiring substrate having connection terminals narrowed in pitch, for example, there is the one as shown in FIG. 1.

FIG. 1 is a cross sectional view showing a related-art semiconductor device. FIG. 2 is a plan view of a related-art wiring substrate.

By reference to FIG. 1, a related-art semiconductor device 100 has a wiring substrate 101 and a semiconductor chip 102. The wiring substrate 101 has insulation layers 104, 106, and 111, a connection terminal 105, vias 107 and 112, wires 108 and 113, an external connection terminal 114, a solder resist 115, and an underfill resin 122. The insulation layer 104 has an opening 104A penetrating through the insulation layer 104.

The connection terminal 105 is disposed in the opening 104A. The widths E1 and E2 of the connection terminal 105 are configured so as to be larger than the diameter D1 of the via 107 (see, FIG. 2). The surface 105A of the connection terminal 105, on the side thereof to which the semiconductor chip 102 is connected, is made generally flush with the surface 104B of the insulation layer 104.

Thus, the surface 105A of the connection terminal 105, on the side thereof to which the semiconductor chip 102 is connected, is made generally flush with the surface 104B of the insulation layer 104. This prevents solder 121 from leaking to the side surface of the connection terminal 105. This prevents a short circuit between the adjacent connection terminals 105 due to the solder 121. Therefore, it is possible to dispose the connection terminals 105 at a narrow mounting pitch.

Further, the surface 105A of the connection terminal 105, on the side thereof to which the semiconductor chip 102 is connected, is made generally flush with the surface 104B of the insulation layer 104. This can prevent the occurrence of voids in the underfill resin 122 disposed between the wiring substrate 101 and the semiconductor chip 102. As a result of this, it becomes possible to sufficiently ensure the connection strength between the semiconductor chip 102 and the wiring substrate 101.

The insulation layer 106 is disposed on the surface 104C of the insulation layer 104. The insulation layer 106 has an opening 106A exposing the connection terminal 105. The via 107 is disposed in the opening 106A. The via 107 is connected with the connection terminal 105. The diameter D1 of the via 107 can be set to be, for example, 50 μm. The wire 108 is disposed on the surface 106B of the insulation layer 106. The wire 108 is connected with the via 107.

The insulation layer 111 is disposed on the surface 106B of the insulation layer 106 so as to cover the via 107 and the wire 108. The insulation layer 111 has an opening 111A. The via 112 is disposed in the opening 111A. The via 112 is connected with the wire 108.

The wire 113 is disposed on the surface 111B of the insulation layer 111. The wire 113 is connected with the via 112. The external connection terminal 114 is disposed on the surface 111B of the insulation layer 111. The external connection terminal 114 is connected with the wire 113. The external connection terminal 114 is electrically connected with the via 112 via the wire 113. The external connection terminal 114 is, for example, for establishing a connection with a mounting board such as a mother board not shown. The solder resist 115 is disposed on the surface 111B of the insulation layer 111 so as to cover the via 112 and the wire 113. The solder resist 115 has an opening 115A exposing the external connection terminal 114.

The semiconductor chip 102 has an electrode pad 118. The electrode pad 118 is provided with an Au bump 119. The Au bump 119 is in contact with the connection terminal 105, and is fixed on the connection terminal 105 by the solder 121. The semiconductor chip 102 is flip-chip connected to the connection terminal 105.

The underfill resin 122 is disposed so as to fill between the wiring substrate 101 and the semiconductor chip 102 (e.g., see Japanese Patent Unexamined Publication No. 2001-284783)

However, with the related-art wiring substrate 101, the widths E1 and E2 of the connection terminal 105 are required to be set larger than the diameter D1 of the via 107. Therefore, unfavorably, it is difficult to narrow the pitch of the connection terminals 105.

SUMMARY

Exemplary embodiments of the present invention provide a wiring substrate capable of narrowing the pitch of connection terminals, and a manufacturing method thereof, and a semiconductor device.

In accordance with one viewpoint of the present invention, there is provided a wiring substrate, which includes a first insulation layer, a connection terminal disposed in the first insulation layer so as to be exposed from a first main surface of the first insulation layer, and to be electrically connected with a semiconductor chip, a second insulation layer disposed on a second main surface of the first insulation layer situated on the opposite side from the first main surface, and a via disposed in the second insulation layer, and to be electrically connected with the connection terminal, wherein the via is separated from the connection terminal, and a wiring pattern for electrically connecting the connection terminal and the via is disposed on the second main surface of the first insulation layer.

In accordance with the present invention, the via is separated from the connection terminal, and the wiring pattern for electrically connecting the connection terminal and the via is disposed on the second main surface of the first insulation layer. As a result, it becomes possible to make the width of the connection terminal smaller than the diameter of the via. Therefore, it is possible to narrow the pitch of the connection terminals.

In accordance with another aspect of the present invention, there is provided a semiconductor device, which includes a wiring substrate having a first insulation layer, a connection terminal disposed in the first insulation layer, and made generally flush with a first main surface of the first insulation layer, a second insulation layer disposed on a second main surface of the first insulation layer situated on the opposite side from the first main surface, and a via disposed in the second insulation layer, a semiconductor chip flip-chip connected to the connection terminal, and an underfill resin disposed between the semiconductor chip and the wiring substrate, wherein the via is separated from the connection terminal, and a wiring pattern for electrically connecting the connection terminal and the via is disposed on the second main surface of the first insulation layer.

In accordance with the present invention, the via is separated from the connection terminal, and the wiring pattern for electrically connecting the connection terminal and the via is disposed on the second main surface of the first insulation layer. As a result, it becomes possible to make the width of the connection terminal smaller than the diameter of the via. Therefore, it is possible to narrow the pitch of the connection terminals.

In accordance with a still other aspect of the present invention, there is provided a method for manufacturing a wiring substrate including a first insulation layer, a plurality of connection terminals disposed on the first insulation layer, and made generally flush with a first main surface of the first insulation layer, a wiring pattern disposed on a second main surface of the first insulation layer situated on the opposite side from the first main surface, and connected to the connection terminals, a second insulation layer disposed on the second main surface of the first insulation layer, and covering the wiring pattern, and a via disposed in the second insulation layer, and connected to the wiring pattern, characterized by including: a first insulation layer formation step of forming the first insulation layer on a metal plate serving as a support substrate, an opening formation step of forming an opening capable of mounting at least two or more of the connection terminals on the first insulation layer, and a connection terminal formation step of forming the connection terminals in the opening.

In accordance with the present invention, the method includes an opening formation step of forming an opening capable of mounting at least two or more of the connection terminals on the first insulation layer. As a result, it is possible to form connection terminals arranged at a narrow pitch.

In accordance with the present invention, it is possible to narrow the pitch of connection terminals.

Other features and advantages may be apparent from the following detailed description, the accompanying drawings and the claims.

DETAILED DESCRIPTION

Then, the present invention will be described by way of embodiments by reference to the accompanying drawings.

First Embodiment

Figure 1:
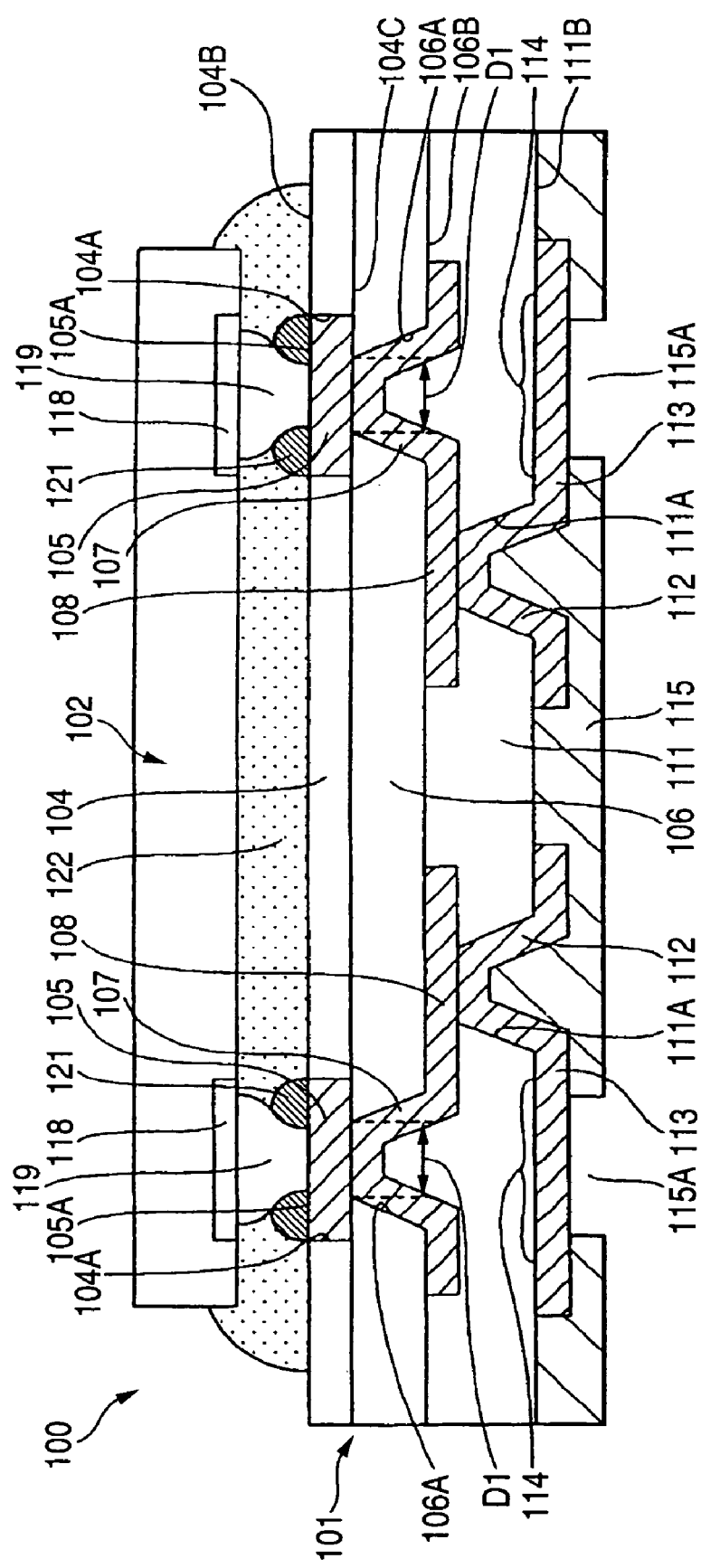
FIG. 1 is a cross sectional view showing a related-art semiconductor device.
Figure 2:
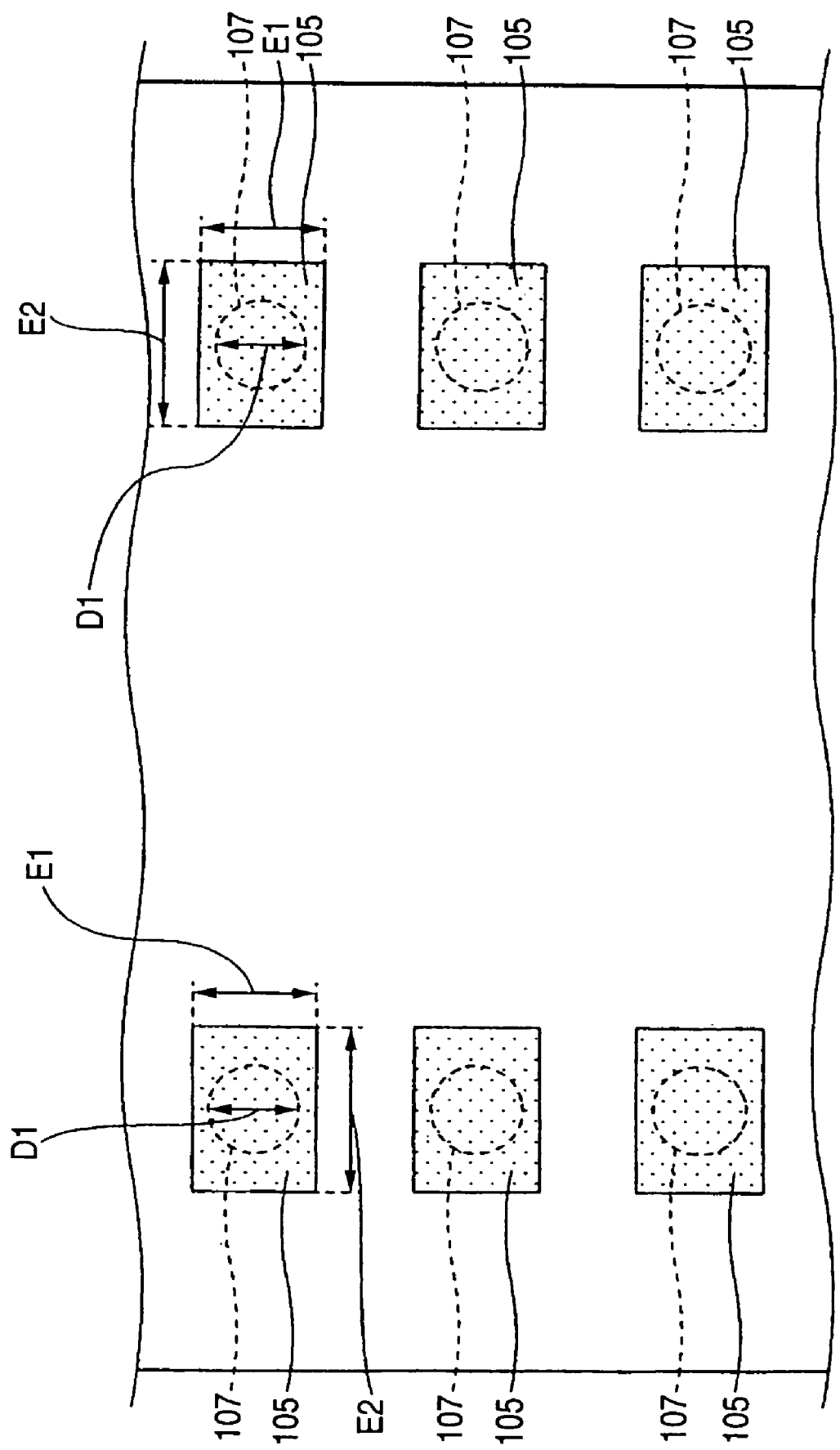
FIG. 2 is a cross sectional view of a related-art wiring substrate.
Figure 3:
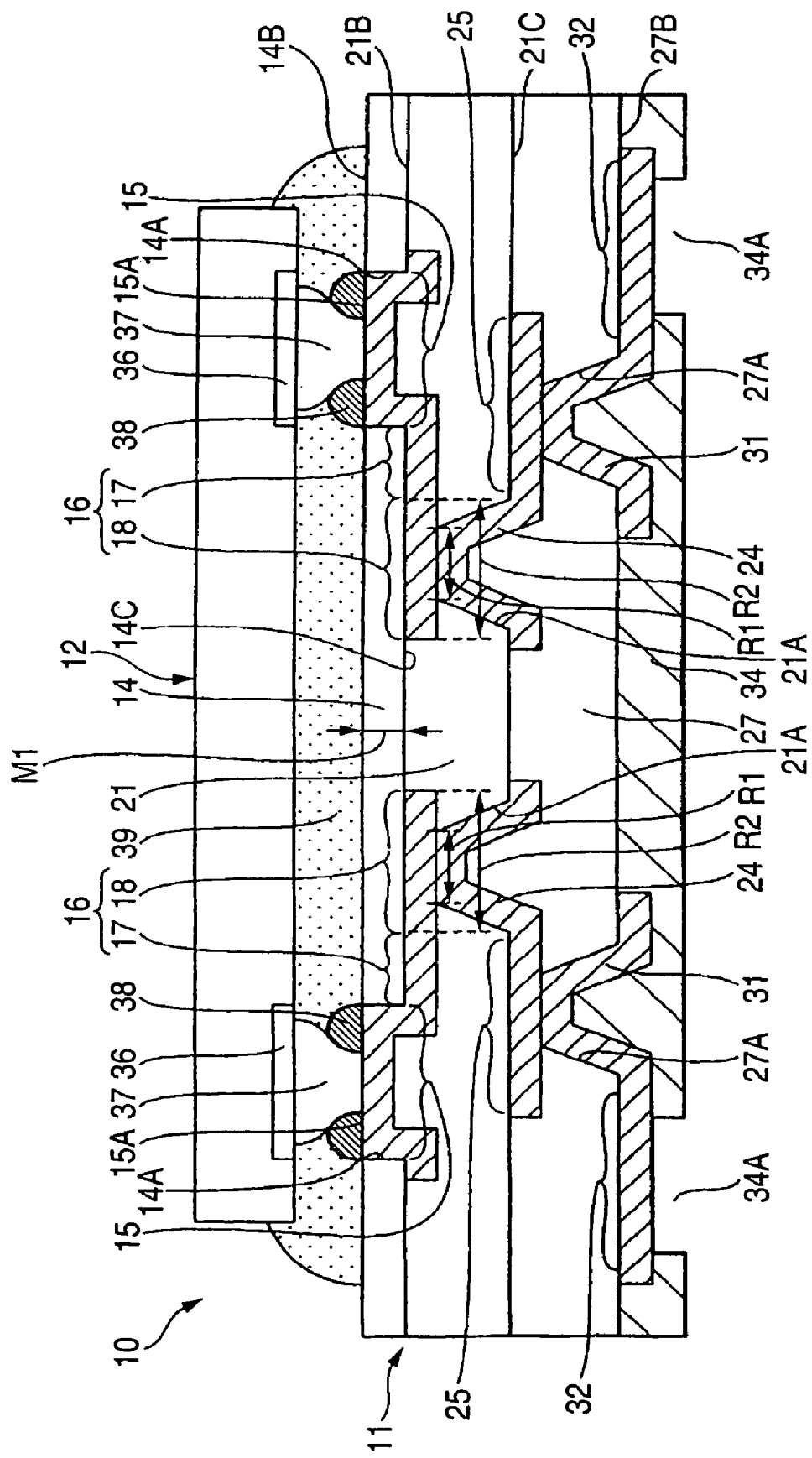
FIG. 3 is a plan view of a semiconductor device in accordance with a first embodiment of the present invention.

FIG. 3 is a cross sectional view of a semiconductor device in accordance with a first embodiment of the present invention.

By reference to FIG. 3, a semiconductor device 10 of the first embodiment has a wiring substrate 11 and a semiconductor chip 12. The wiring substrate 11 has an insulation layer 14 which is a first insulation layer, a connection terminal 15, a wiring pattern 16, an insulation layer 21 which is a second insulation layer, vias 24 and 31, a via connection part 25, an insulation layer 27, an external connection terminal 32, and a solder resist 34.

Figure 4:
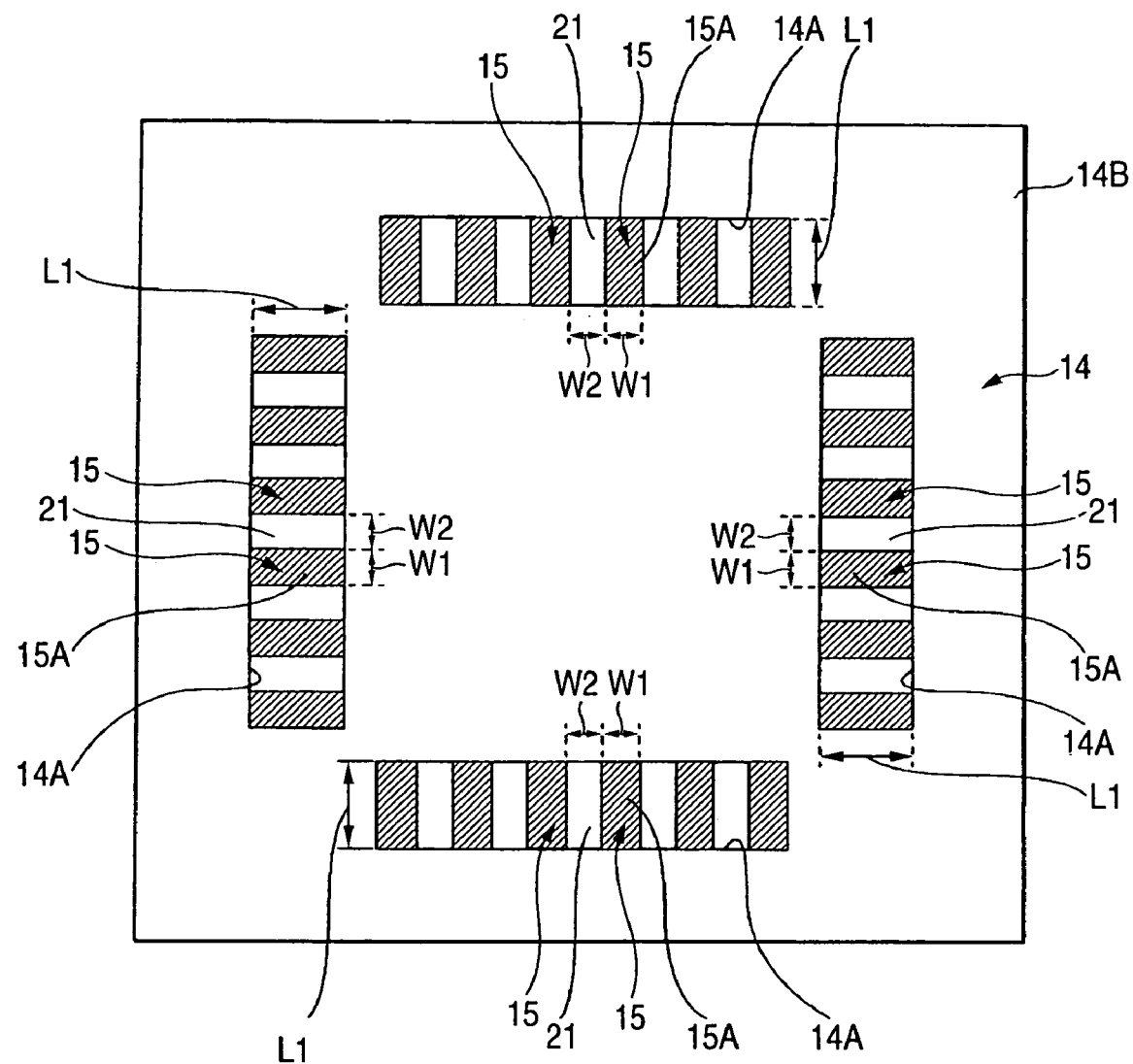
FIG. 4 is a plan view of a wiring substrate shown in FIG. 3.

FIG. 4 is a plan view of the wiring substrate shown in FIG. 3.

The insulation layer 14 has an opening 14A penetrating through the insulation layer 14. By reference to FIG. 4, the opening 14A is formed in such a shape as to be capable of mounting at least two or more connection terminals 15. As the insulation layer 14, a thermosetting resin or a photosensitive resin can be used. The thickness M1 of the insulation layer 14 can be set to be, for example, 5 μm to 10 μm.

Thus, the opening 14A is formed in a shape having such a size as to be capable of mounting at least two or more connection terminals 15. As a result, it is possible to form the opening 14A in the insulation layer 14 with ease.

By reference to FIGS. 3 and 4, the connection terminal 15 is mounted in the opening 14A. An Au bump 37 disposed on the semiconductor chip 12 is in contact with the surface 15A of the connection terminal 15. On the surface 15A of the connection terminal 15, solder 38 for connecting the Au bump 37 to the connection terminal 15 is disposed. The surface 15A of the connection terminal 15 is made generally flush with the top side 14B of the first insulation layer 14. The width W1 of the connection terminal 15 can be set to be, for example, 20 μm. Whereas, the mounting pitch W2 of the connection terminals 15 can be set to be, for example, 20 μm. The length L1 of the connection terminal 15 can be set to be, for example, 500 μm.

Thus, the surface 15A of the connection terminal 15, on the side thereof to which the semiconductor chip 12 is connected, is made generally flush with the top side 14B of the insulation layer 14. This prevents solder 38 from leaking to the side surface of the connection terminal 15. This prevents a short circuit between the adjacent connection terminals 15 due to the solder 38. Therefore, it is possible to dispose the connection terminals 15 at a narrow mounting pitch.

Further, the surface 15A of the connection terminal 15, on the side thereof to which the semiconductor chip 12 is connected, is made generally flush with the surface 14B of the insulation layer 14. As a result of this, it becomes possible to sufficiently ensure the clearance between the wiring substrate 11 and the semiconductor chip 12. This can prevent the occurrence of voids in an underfill resin 39 filling between the wiring substrate 11 and the semiconductor chip 12.

The wiring pattern 16 has a wiring part 17 and a via connection part 18. The wiring part 17 is disposed on the surface 14C of the insulation layer 14. The wiring part 17 is connected with the connection terminal 15. The wiring part 17 is for establishing an electrical connection between the connection terminal 15 and the via connection part 18.

Provision of such a wiring part 17 can dispose the via connection part 18 to be electrically connected with the connection terminal 15 at a prescribed position.

The connection terminal 15 and the wiring pattern 16 described above are integrally formed such that the wiring pattern 16 extends from the connection terminal 15 over from the opening 14A portion to the surface 14C of the insulation layer 14.

The via connection part 18 is disposed on the surface 14C of the insulation layer 14. The via connection part 18 is separated from the connection terminal 15. Further, the via connection part 18 is formed in a shape larger in width than the connection terminal 15. The via connection part 18 is connected with the wiring part 17. The via connection part 18 is electrically connected with the connection terminal 15 via the wiring part 17. To the via connection part 18, the via 24 is connected.

Figure 5:
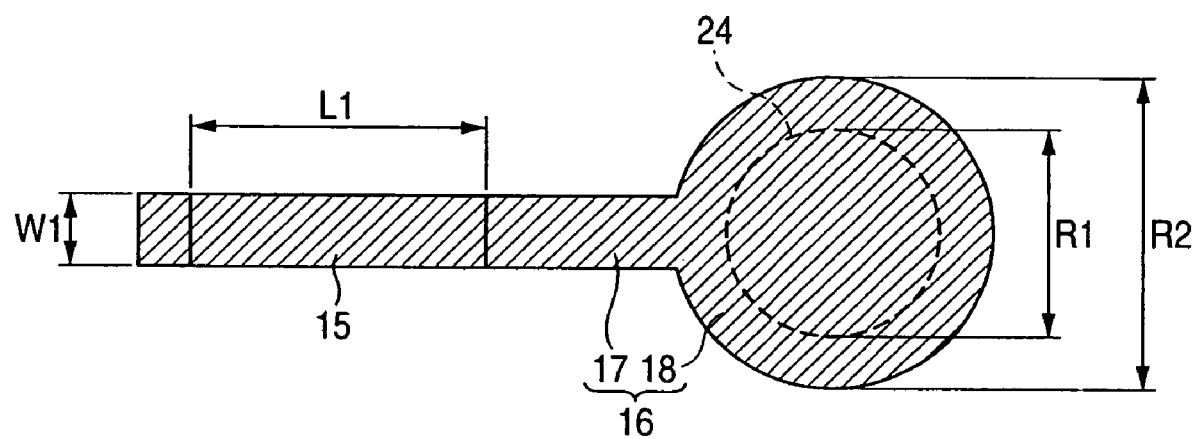
FIG. 5 is a plan view of a connection terminal and a wiring pattern shown FIG. 3.

FIG. 5 is a plan view of the connection terminal and the wiring pattern shown in FIG. 3.

By reference to FIG. 5, the via connection part 18 is circular in plan configuration. The via connection part 18 is formed in a shape larger in width than the diameter R1 of the via 24. When the diameter R1 of the via 24 is 50 μm, the diameter R2 of the via connection part 18 can be set to be, for example, 130 μm.

Thus, the wiring pattern 16 including the wiring part 17 for establishing an electrical connection between the connection terminal 15 and the via connection part 18, and the via connection part 18 formed in a shape larger in width than the diameter R1 of the via 24 is disposed on the surface 14C of the insulation layer 14. This eliminates the necessity of establishing a direct connection between the connection terminal 15 and the via 24. As a result of this, it becomes possible to make small the width W1 and the mounting pitch W2 of the connection terminals 15. As a result, it is possible to mount the connection terminals 15 at a narrow pitch.

By reference to FIG. 3, the insulation layer 21 is disposed on the surface 14C of the insulation layer 14 in such a manner as to cover the connection terminal 15, the via connection part 18, and the wiring part 17. The insulation layer 21 has an opening 21A exposing a part of the via connection part 18. As the insulation layer 21, a thermosetting resin or a photosensitive resin can be used.

The via 24 is disposed in the opening 21A. The via 24 is connected with the via connection part 18. The via connection part 25 is disposed on the surface 21C of the insulation layer 21. The via connection part 25 is connected with the via 24.

The insulation layer 27 is disposed on the surface 21C of the insulation layer 21 in such a manner as to cover the via 24 and a part of the via connection part 25. The insulation layer 27 has an opening 27A exposing a part of the via connection part 25. As the insulation layer 27, a thermosetting resin or a photosensitive resin can be used.

The via 31 is disposed in the opening 27A. The via 31 is connected with the via connection part 25. The external connection terminal 32 is disposed on the surface 27B of the insulation layer 27. The external connection terminal 32 is for establishing a connection with a mounting board such as a mother board. The solder resist 34 is disposed on the surface 27B of the insulation layer 27 in such a manner as to cover the via 31.

The semiconductor chip 12 has an electrode pad 36. The electrode pad 36 is provided with an Au bump 37. The Au bump 37 is in contact with the top surface 15A of the connection terminal 15. As a result of this, the Au bump 37 is electrically connected with the connection terminal 15. Further, the periphery of the Au bump 37 is covered with the solder 38 disposed on the top surface 15A of the connection terminal 15. In other words, the semiconductor chip 12 is flip-chip connected to the connection terminal 15.

The underfill resin 39 is disposed so as to fill between the wiring substrate 11 and the semiconductor chip 12. The underfill resin 39 is for improving the connection strength between the semiconductor chip 12 and the wiring substrate 11, and for reducing the stress caused by the difference in thermal expansion between the semiconductor chip 12 and the wiring substrate 11.

With the semiconductor device of this embodiment, the wiring pattern 16 including the wiring part 17 for establishing an electrical connection between the connection terminal 15 and the via connection part 18, and the via connection part 18 formed in a shape larger in width than the diameter R1 of the via 24 is disposed on the surface 14C of the insulation layer 14. This eliminates the necessity of establishing a direct connection between the connection terminal 15 and the via 24. As a result of this, it is possible to make small the width W1 and the mounting pitch W2 of the connection terminals 15, and to mount the connection terminals 15 at a narrow pitch.

Whereas, the surface 15A of the connection terminal 15, on the side thereof to which the semiconductor chip 12 is connected, is made generally flush with the surface 14B of the insulation layer 14. As a result, the solder 38 will not leak to the side surface of the connection terminal 15. This prevents a short circuit between the adjacent connection terminals 15 via the solder 38. Accordingly, it is possible to mount the connection terminals 15 at a narrow pitch.

Further, the surface 15A of the connection terminal 15, on the side thereof to which the semiconductor chip 12 is connected, is made generally flush with the surface 14B of the insulation layer 14. As a result of this, it becomes possible to sufficiently ensure the clearance between the wiring substrate 11 and the semiconductor chip 12. This can prevent the occurrence of voids in the underfill resin 39 filling between the wiring substrate 11 and the semiconductor chip 12.

Figure 18:
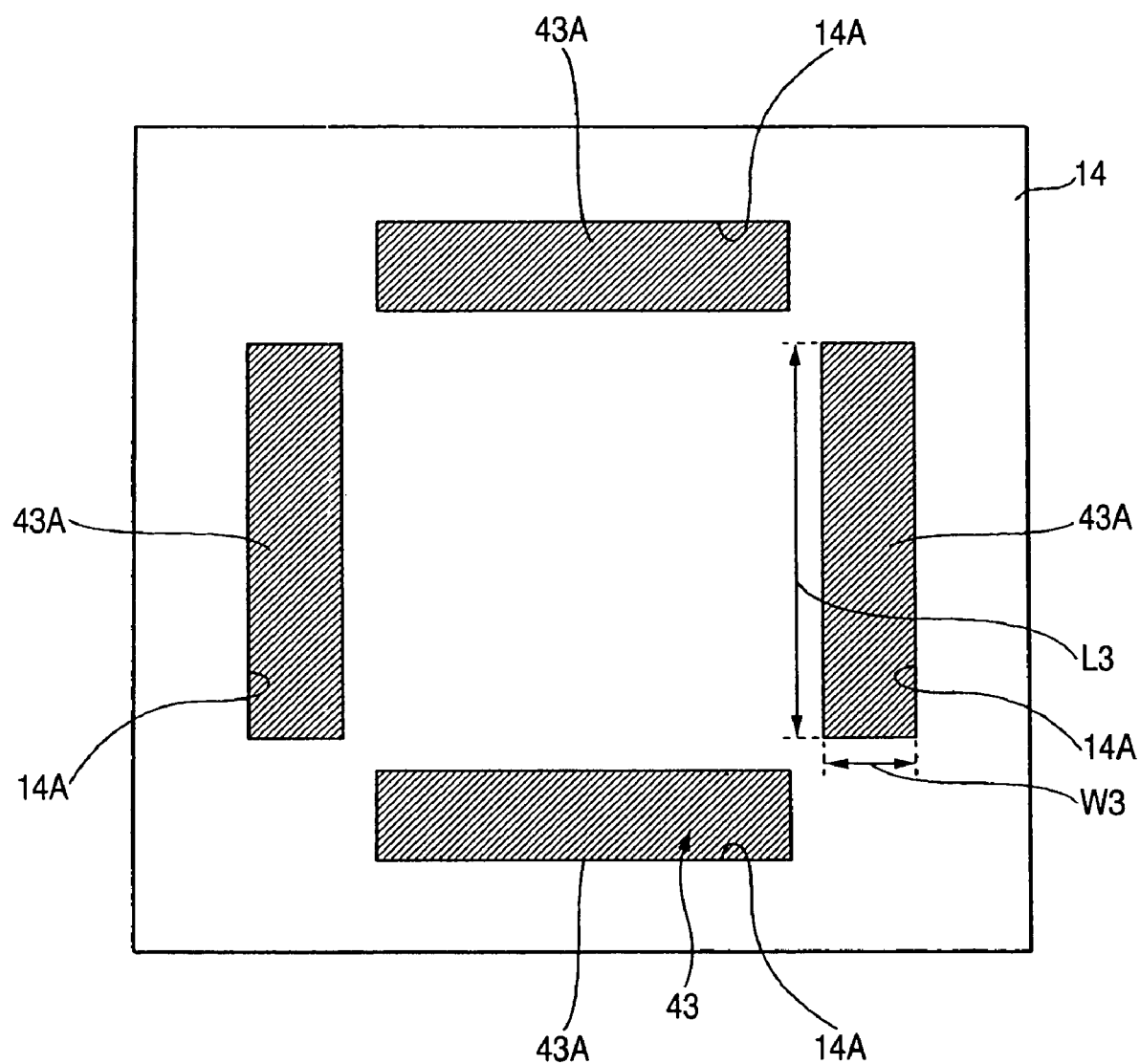
FIG. 18 is a plan view of the structure shown in FIG. 7.
Figure 19:
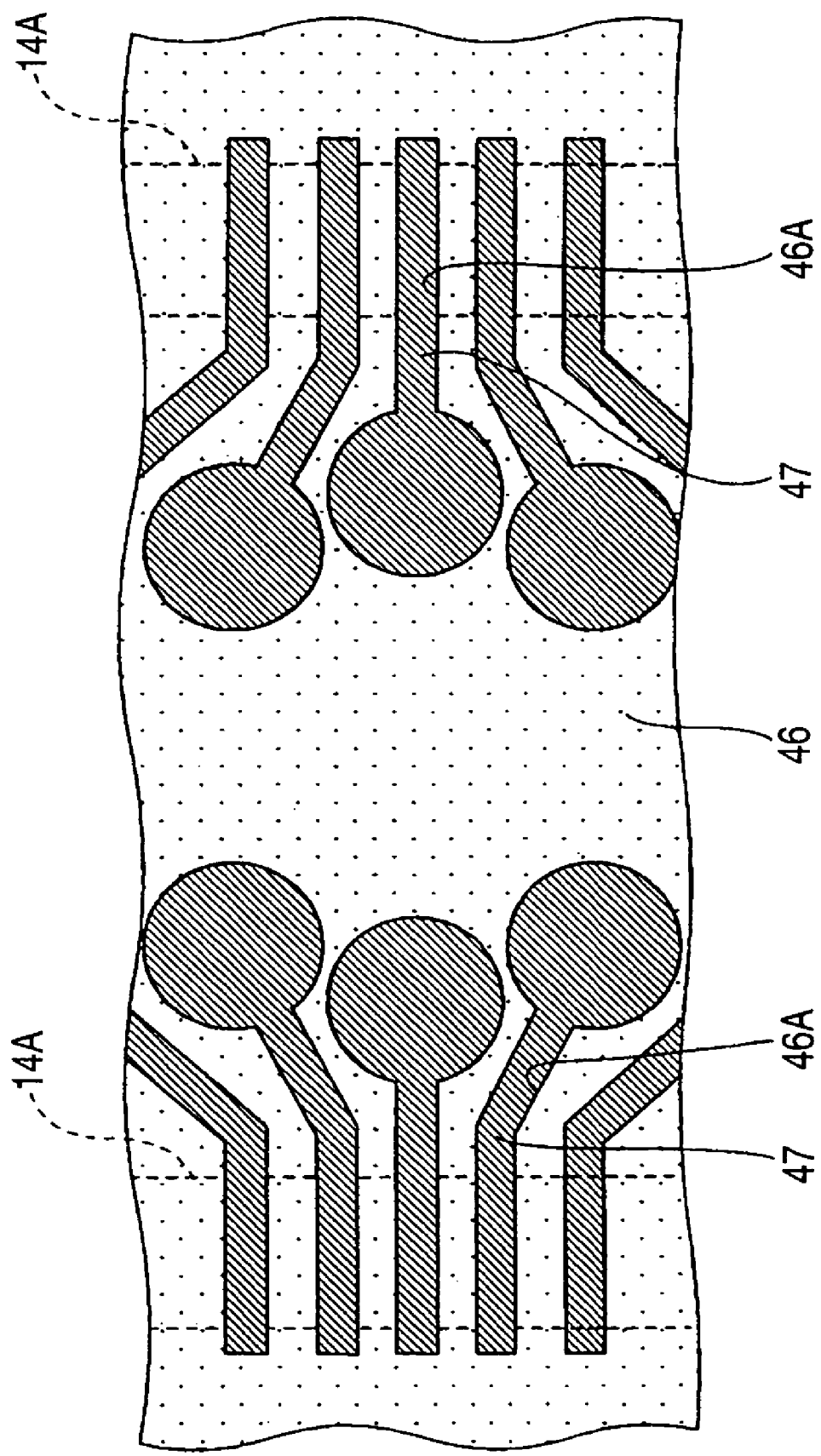
FIG. 19 is a plan view of the structure shown in FIG. 9.
Figure 20:
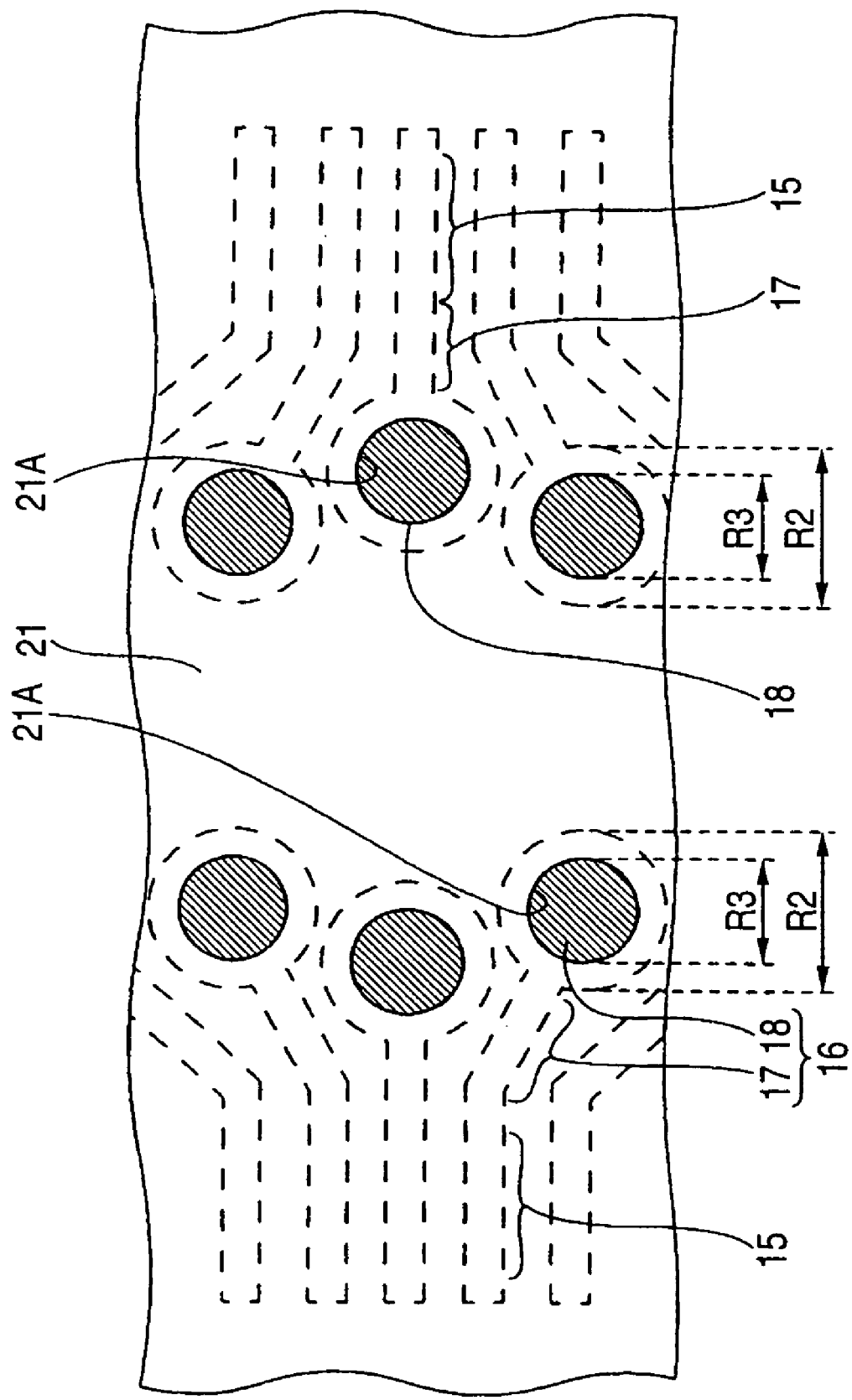
FIG. 20 is a plan view of the structure shown in FIG. 12.

FIGS. 6 to 17 are views each showing a manufacturing step of the wiring substrate in accordance with the first embodiment of the present invention. FIG. 18 is a plan view of a structure shown in FIG. 7. FIG. 19 is a plan view of a structure shown in FIG. 9. FIG. 20 is a plan view of a structure shown in FIG. 12. In FIGS. 6 to 20, the same constitutional components as those of the wiring substrate 11 described previously are given the same reference numerals and signs.

Figure 6:
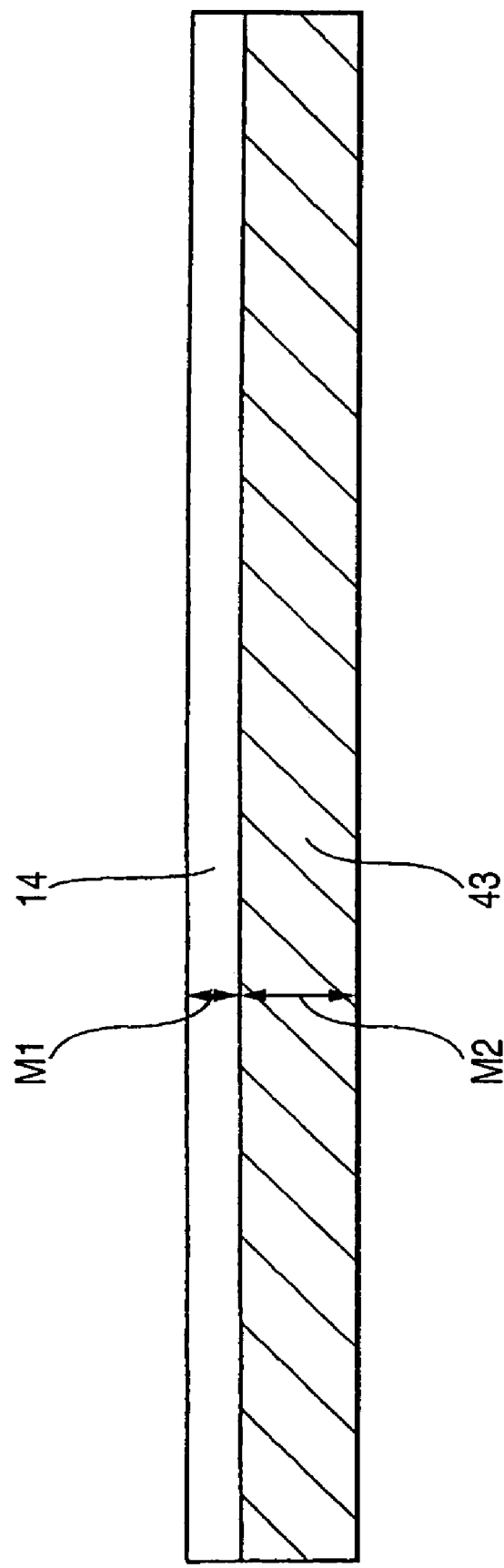
FIG. 6 is a view (first) showing a manufacturing step of the wiring substrate in accordance with the first embodiment of the present invention.

First, in a step shown in FIG. 6, the insulation layer 14 is formed on a metal plate 43 serving as a support plate (first insulation layer formation step). As the metal plate 43, for example, a Cu plate can be used. A thickness M2 of the metal plate 43 can be set to be, for example, 50 μm to 200 μm. In this embodiment, a description is given by taking the case where the metal plate 43 is used as the support plate as an example. However, metal foil (e.g., Cu foil) may be used in place of the metal plate 43. Further, a sheet of the metal plate 43 has a plurality of wiring substrate formation regions in which the wiring substrate 11 is formed. A plurality of the wiring substrates 11 are simultaneously formed in a sheet of the metal plate 43. A plurality of the wiring substrate formation regions are arranged in a grid.

As the insulation layer 14, for example, a thermosetting resin or a photosensitive resin can be used. A solder resist can be used as the insulation layer 14. When a thermosetting resin or a photosensitive resin is used for the insulation layer 14, the insulation layer 14 can be formed by a printing method. The thickness M1 of the insulation layer 14 can be set to be, for example, 5 μm to 10 μm.

Figure 7:
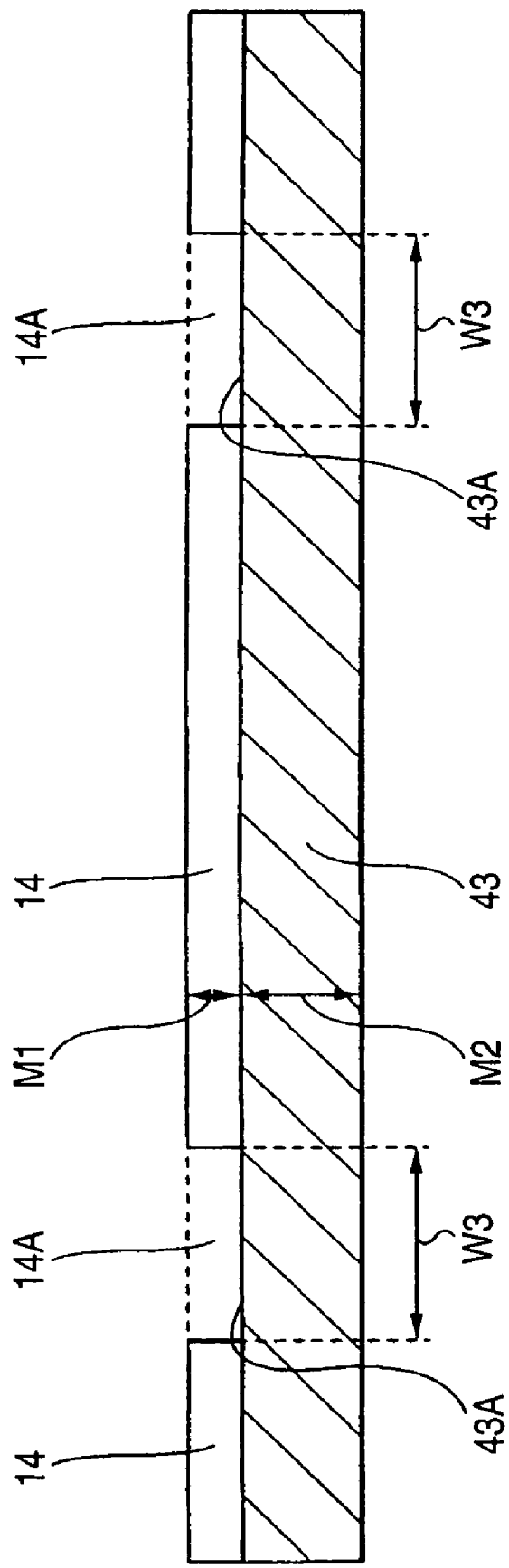
FIG. 7 is a view (second) showing a manufacturing step of the wiring substrate in accordance with the first embodiment of the present invention.

Then, in a step shown in FIG. 7, an opening 14A capable of mounting at least two or more connection terminals 15 is formed in the insulation layer 14 (opening formation step). The opening 14A is formed so as to expose the top surface 43A of the metal plate 43. When a thermosetting resin is used for the insulation layer 14, the opening 14A is formed by using, for example, laser. When a photosensitive resin is used for the insulation layer 14, the opening 14A is formed by photolithography. As shown in FIG. 18, the opening 14A is an opening having a large opening area. The width W3 of the opening 14A can be set to be, for example, 500 μm. Whereas, the length L3 of the opening 14A can be set to be, for example, 3 mm.

Thus, as the opening for mounting the connection terminals 15, the opening 14A configured to have a size capable of mounting at least two or more connection terminals 15 is formed. As a result, it is possible to form the opening 14A more easily as compared with the case where an opening with a size corresponding to that of one connection terminal 15 is formed.

Figure 8:
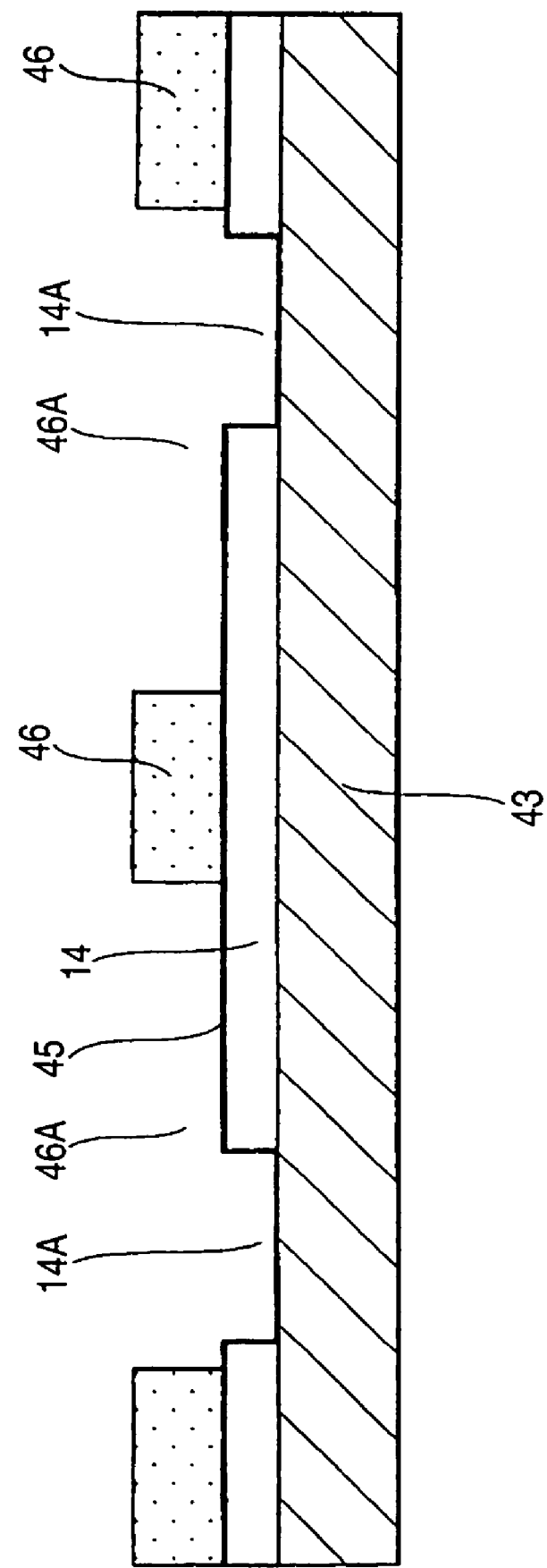
FIG. 8 is a view (third) showing a manufacturing step of the wiring substrate in accordance with the first embodiment of the present invention.

Then, in a step shown in FIG. 8, a seed layer 45 is formed in such a manner as to cover the top surface side of the structure shown in FIG. 7. Then, a resist film 46 having openings 46A is formed on the seed layer 45. The seed layer 45 can be formed by, for example, a sputtering method or an electroless plating method. As the seed layer 45, for example, a Cu layer can be used. The openings 46A are formed so as to expose the portions of the seed layer 45 corresponding to the formation region of the connection terminals 15 and the wiring pattern 16.

Figure 9:
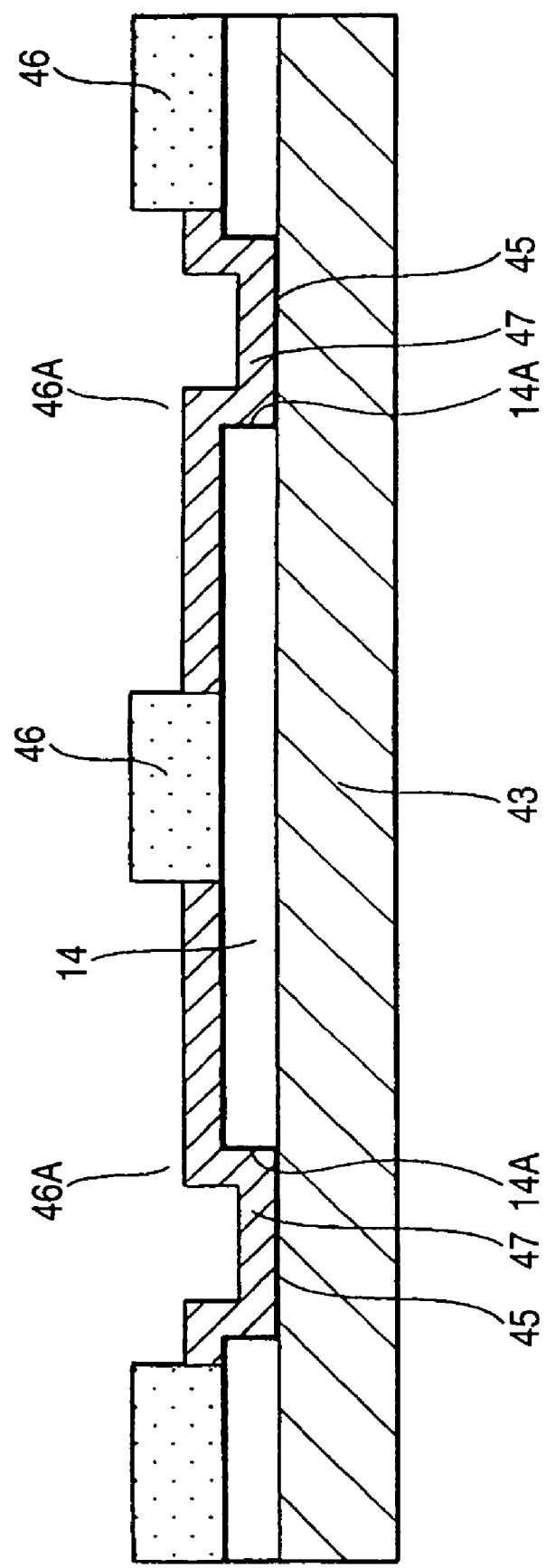
FIG. 9 is a view (fourth) showing a manufacturing step of the wiring substrate in accordance with the first embodiment of the present invention.
Figure 10:
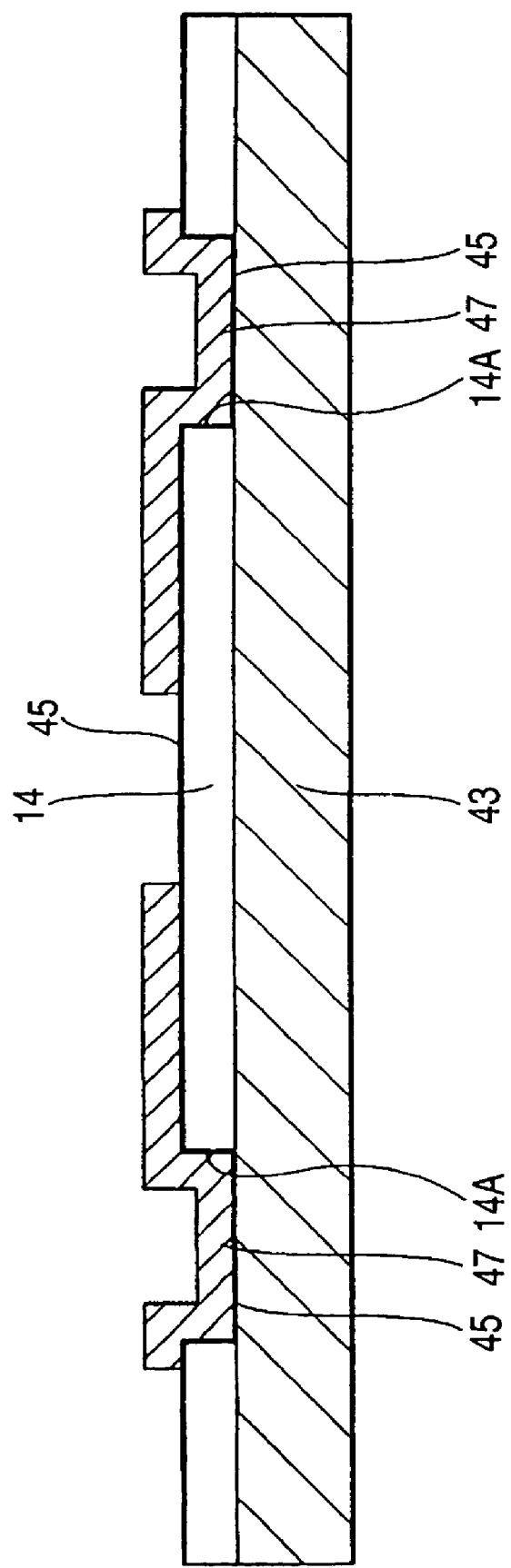
FIG. 10 is a view (fifth) showing a manufacturing step of the wiring substrate in accordance with the first embodiment of the present invention.

Then, in a step shown in FIG. 9, a plating film 47 is formed on the seed layer 45 exposed at the openings 46A. As the plating film 47, for example, a Cu plating film can be used (for a plan view of the structure shown in FIG. 9, see, FIG. 19). Then, in a step shown in FIG. 10, the resist film 46 is removed.

Figure 11:
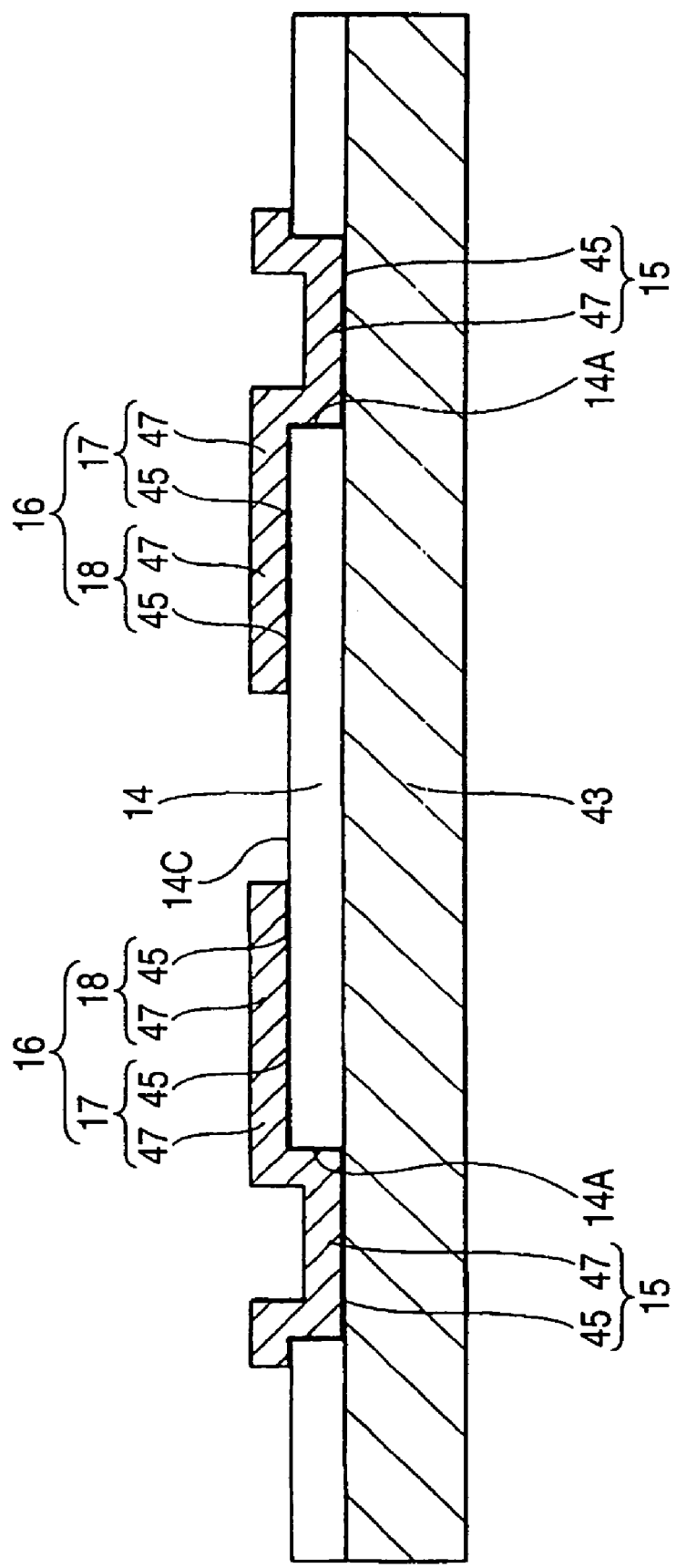
FIG. 11 is a view (sixth) showing a manufacturing step of the wiring substrate in accordance with the first embodiment of the present invention.

Then, in a step shown in FIG. 11, unnecessary portions of the seed layer 45 not covered with the plating film 47 are removed. As a result of this, the connection terminals 15 and the wiring pattern 16 including the wiring part 17 and the via connection part 18 are simultaneously formed (connection terminal formation step). The connection terminal 15 and the wiring pattern 16 are formed of the seed layer 45 and the plating film 47. The connection terminal 15 and the wiring pattern 16 are integrally formed such that the wiring pattern 16 extends from the connection terminal 15 over from the opening 14A portion to the surface 14C of the insulation layer 14.

Figure 12:
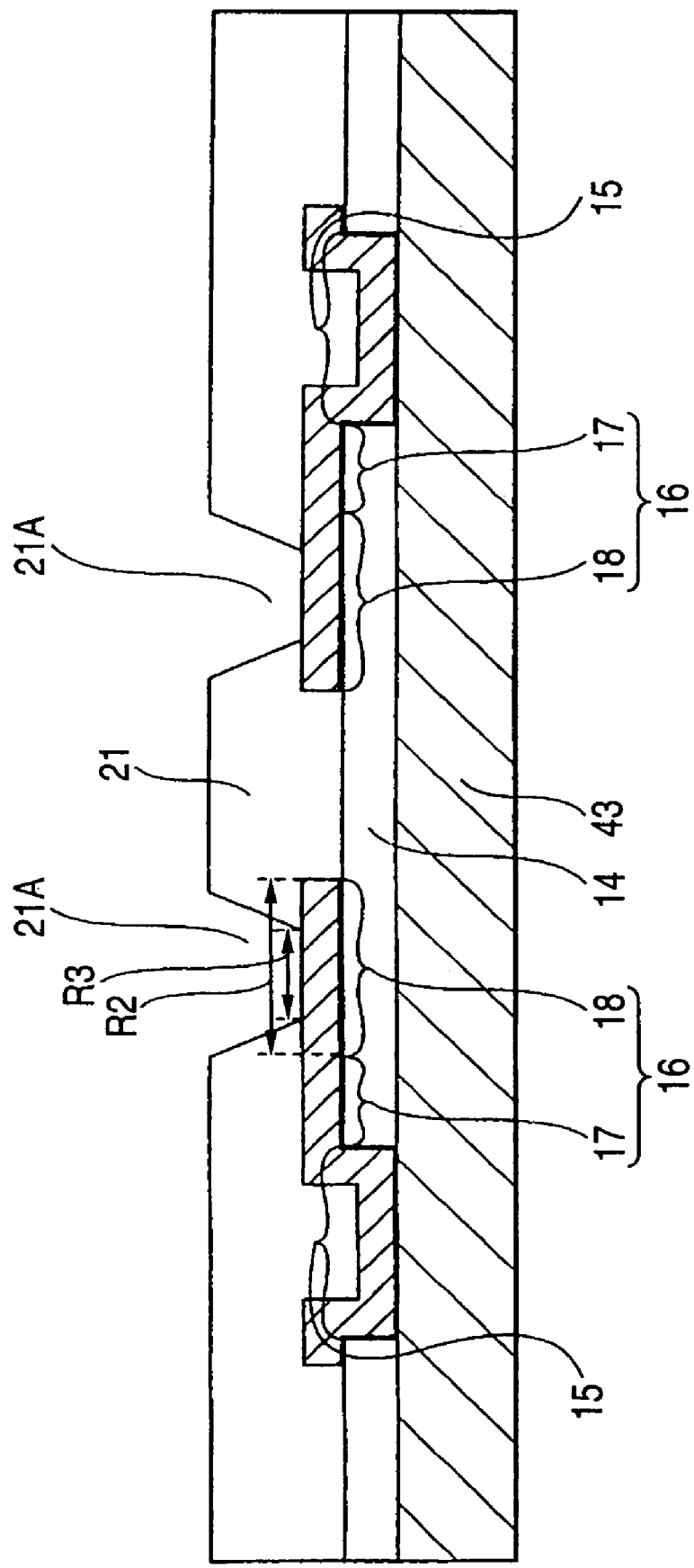
FIG. 12 is a view (seventh) showing a manufacturing step of the wiring substrate in accordance with the first embodiment of the present invention.

Then, in a step shown in FIG. 12, the insulation layer 21 having openings 21A is formed on the structure shown in FIG. 11 (for the plan view of the structure shown in FIG. 12, see, FIG. 20). The diameter R3 of the opening 21A is smaller than the diameter R2 of the via connection part 18. The diameter R3 of the opening 21A can be set to be, for example, 50 μm. When a thermosetting resin is used for the insulation layer 21, the opening 21A is formed by, for example, laser. When a photosensitive resin is used for the insulation layer 21, the opening 21A is formed by photolithography. When the diameter R3 of the opening 21A is 50 μm, the diameter R2 of the via connection part 18 can be set to be, for example, 130 μm.

Figure 13:
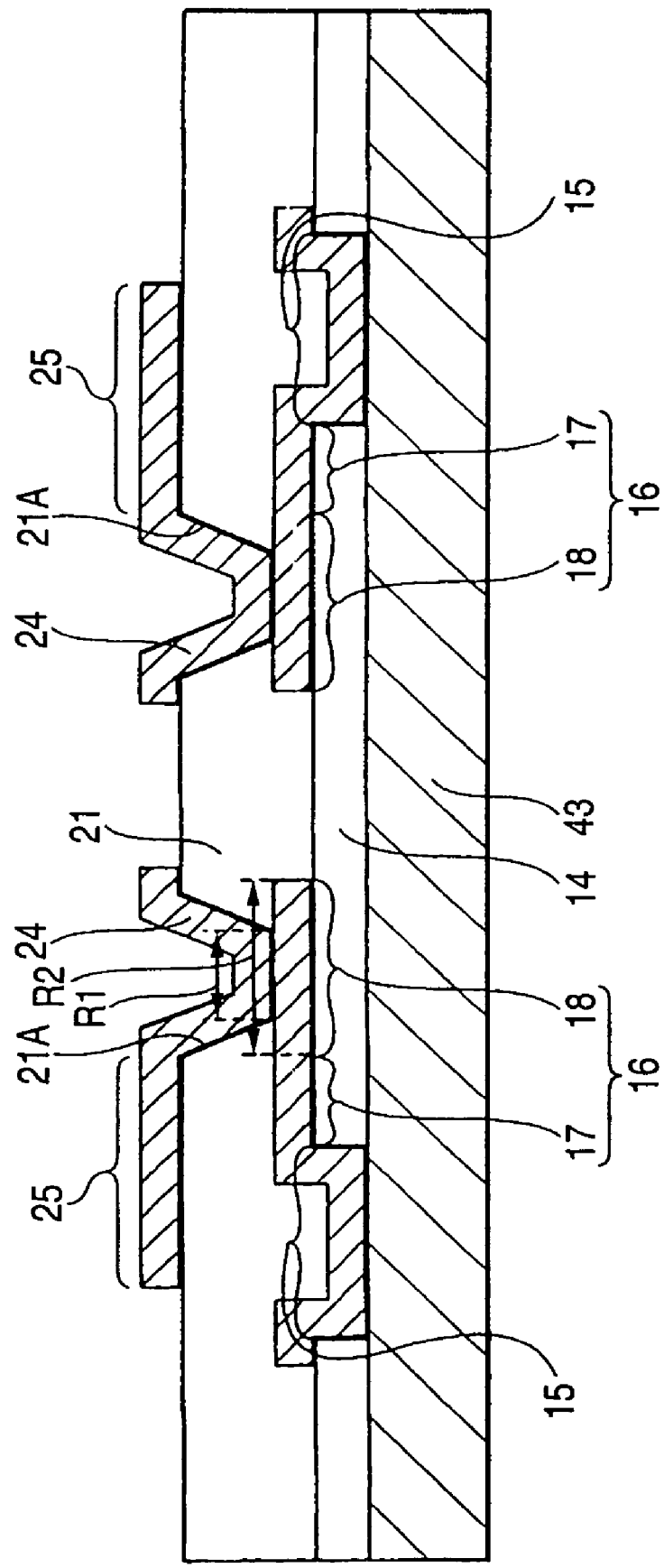
FIG. 13 is a view (eighth) showing a manufacturing step of the wiring substrate in accordance with the first embodiment of the present invention.

Then, in a step shown in FIG. 13, the via 24 and the via connection part 25 are simultaneously formed with the same procedure as the steps shown in FIGS. 8 to 11 described previously. The via 24 and the via connection part 25 are formed of the seed layer and the plating film. The diameter R1 of the via 24 is generally equal to the diameter R3 of the opening 21A. The diameter R1 of the via 24 can be set to be, for example, 50 μm.

Figure 14:
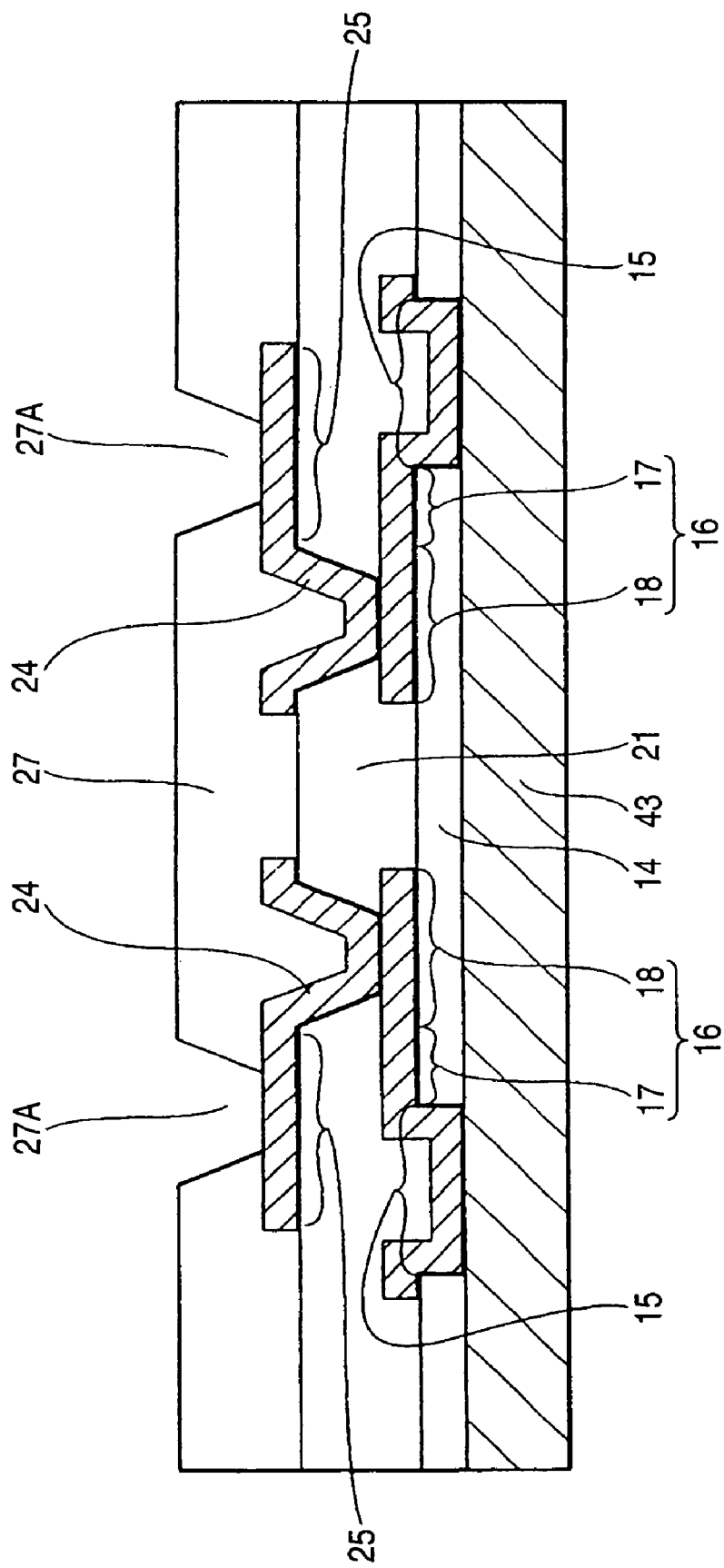
FIG. 14 is a view (ninth) showing a manufacturing step of the wiring substrate in accordance with the first embodiment of the present invention.

Then, in a step shown in FIG. 14, the insulation layer 27 having openings 27A is formed on the structure shown in FIG. 13. As the insulation layer 27, for example, a thermosetting resin or a photosensitive resin can be used. The insulation layer 27 having the openings 27A can be formed with the same procedure as the steps shown in FIG. 12 described previously.

Figure 15:
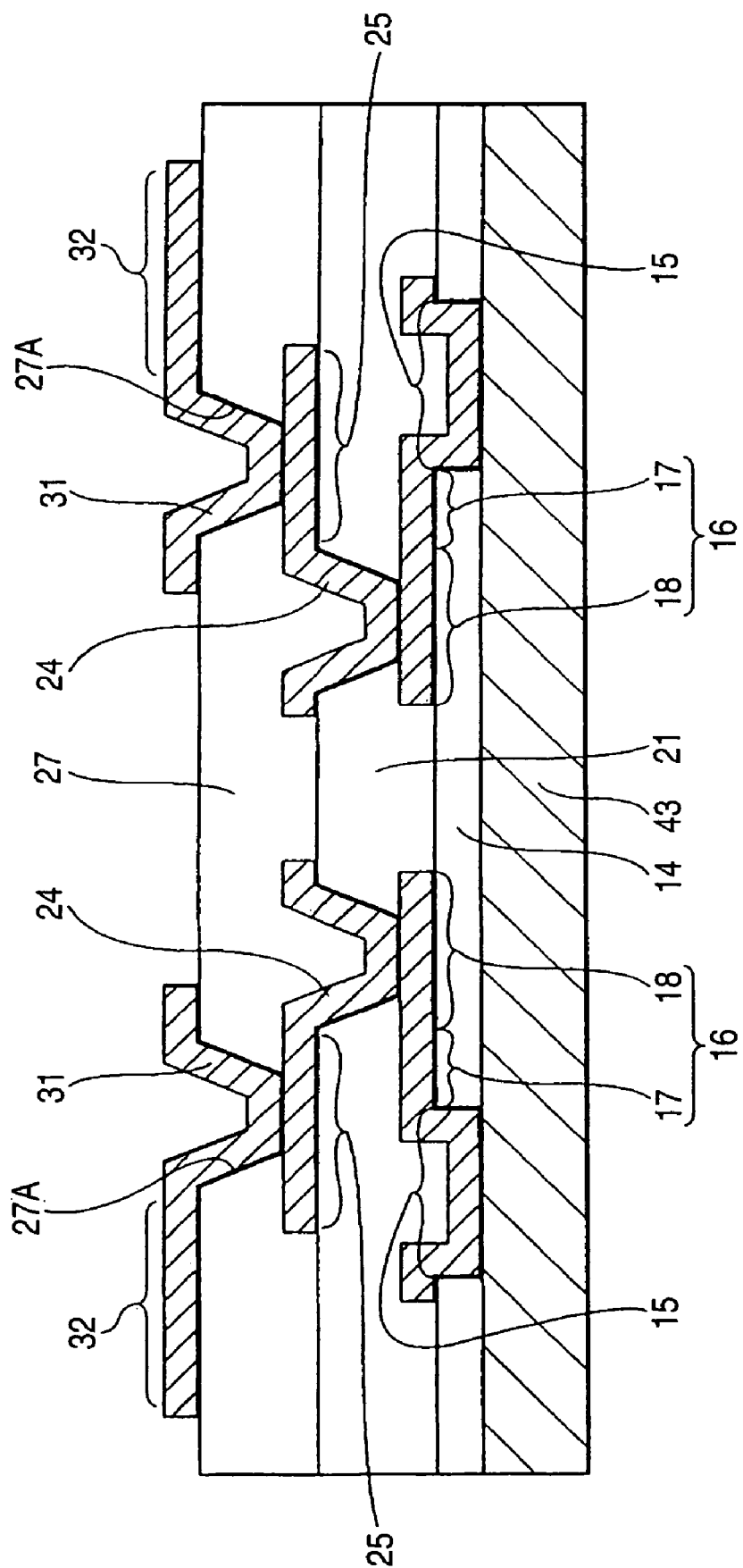
FIG. 15 is a view (tenth) showing a manufacturing step of the wiring substrate in accordance with the first embodiment of the present invention.

Then, in a step shown in FIG. 15, the via 31 and the external connection terminal 32 are simultaneously formed with the same procedure as the steps shown in FIGS. 8 to 11 described previously. The via 31 and the external connection terminal 32 are formed of the seed layer and the plating film.

Figure 16:
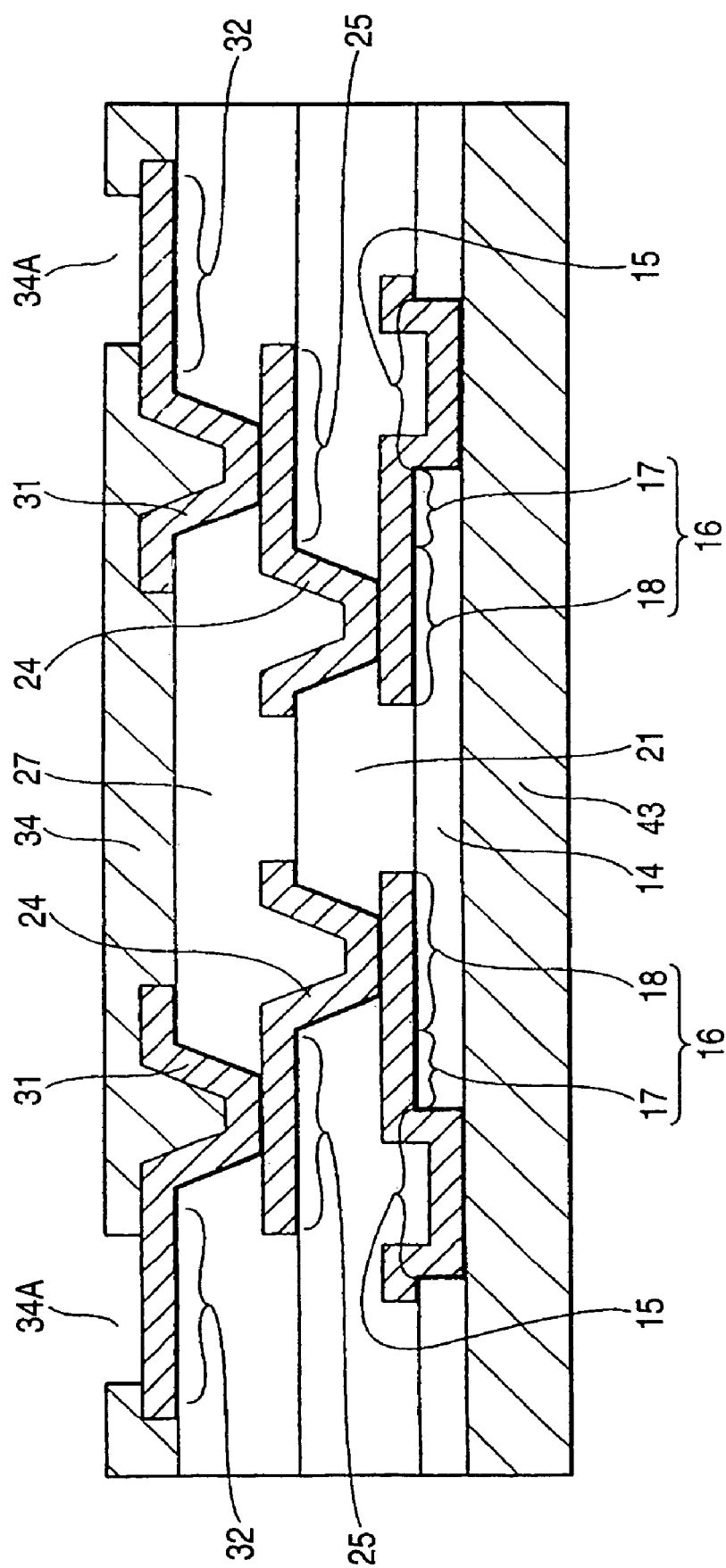
FIG. 16 is a view (eleventh) showing a manufacturing step of the wiring substrate in accordance with the first embodiment of the present invention.

Then, in a step shown in FIG. 16, the solder resist 34 having the openings 34A is formed in such a manner as to cover the top surface side of the structure shown in FIG. 15. The opening 34A is formed in such a manner as to expose the external connection terminal 32.

Figure 17:
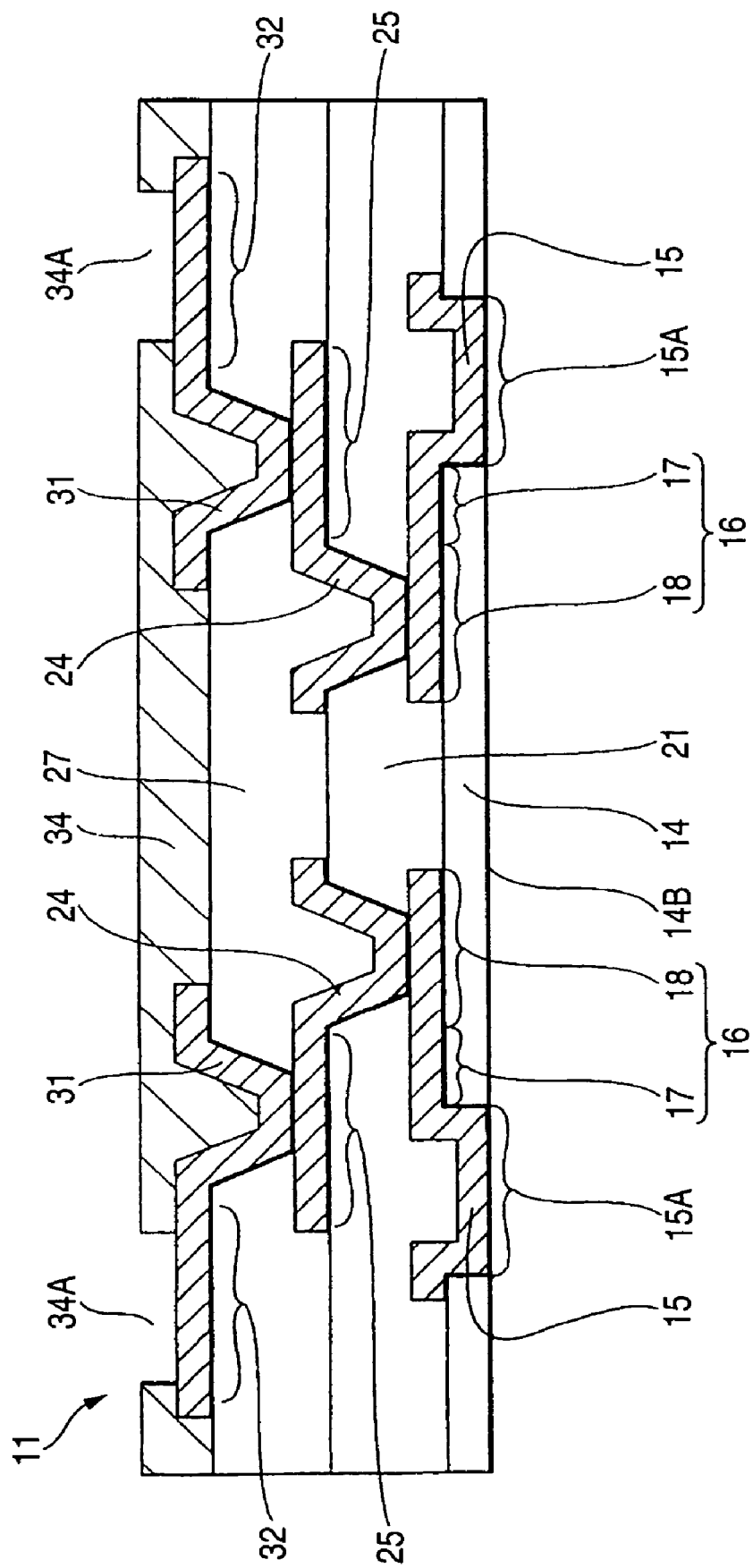
FIG. 17 is a view (twelfth) showing a manufacturing step of the wiring substrate in accordance with the first embodiment of the present invention.

Then, in a step shown in FIG. 17, the metal plate 43 which is a support plate is removed (metal plate removing step). Then, the insulation layers 14, 21, and 27 situated between the wiring substrate formation regions are cut, so that the wiring substrate 11 is formed into individual pieces. As a result, a plurality of wiring substrates 11 are manufactured. Incidentally, in FIG. 17, only one wiring substrate 11 is shown. When Cu foil or a Cu plate is used as the metal plate 43, the metal plate 43 can be removed by wet etching. At this step, the metal plate 43 may be removed in such a manner that the metal plate 43 is left in a frame-like configuration around the chip mounting part.

With the manufacturing method of the wiring substrate of this embodiment, the opening 14A capable of mounting at least two or more connection terminals 15 is formed in the insulation layer 14. As a result, it is possible to form the opening 14A more easily as compared with the case where openings each in a small shape corresponding to the shape of one connection terminal 15 is formed in the insulation layer 14. This can reduce the manufacturing cost of the wiring substrate 11.

FIGS. 21 to 24 are each a view showing a manufacturing step of the wiring substrate in accordance with a modified example of the first embodiment of the present invention.

Figure 21:
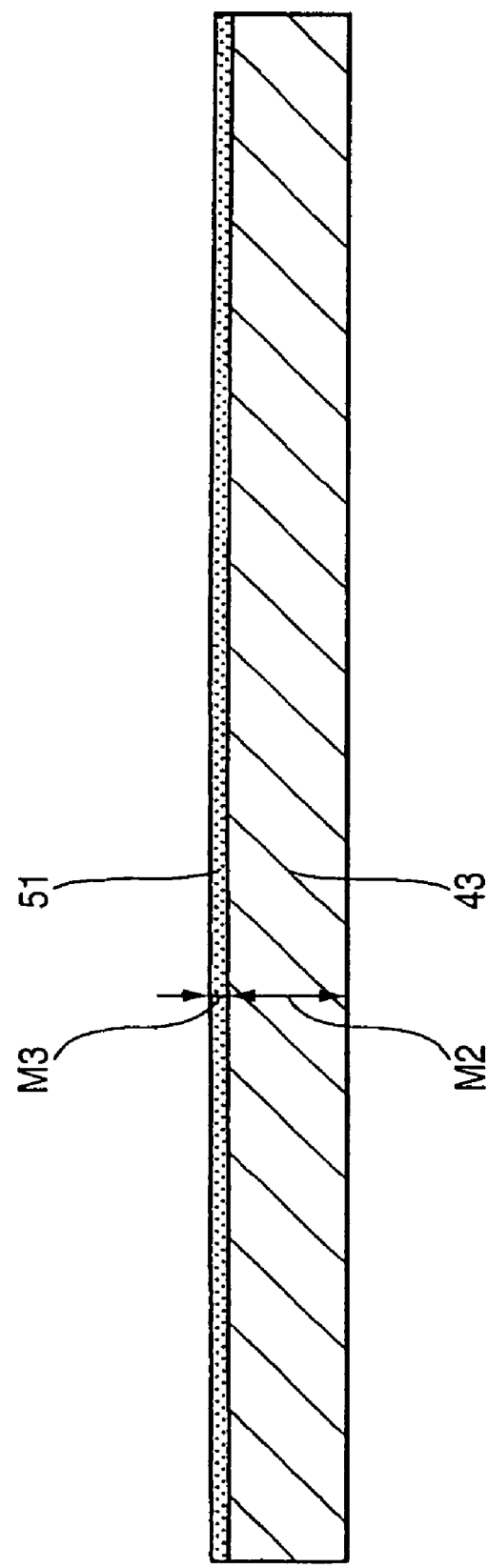
FIG. 21 is a view (first) showing a manufacturing step of a wiring substrate in accordance with a modified example of the first embodiment of the present invention.

First, in a step shown in FIG. 21, a metal layer 51 is formed on the metal plate 43 serving as the support plate. The metal layer 51 is formed of a metal which is resistant to etching by the etchant for use in removing the metal plate 43. When the metal forming the metal plate 43, the seed layer 45, and the plating film 47 is Cu, as the material for the metal layer 51, for example, Ni can be used. The thickness M3 of the metal layer 51 can be set to be, for example, 5 µm.

Figure 22:
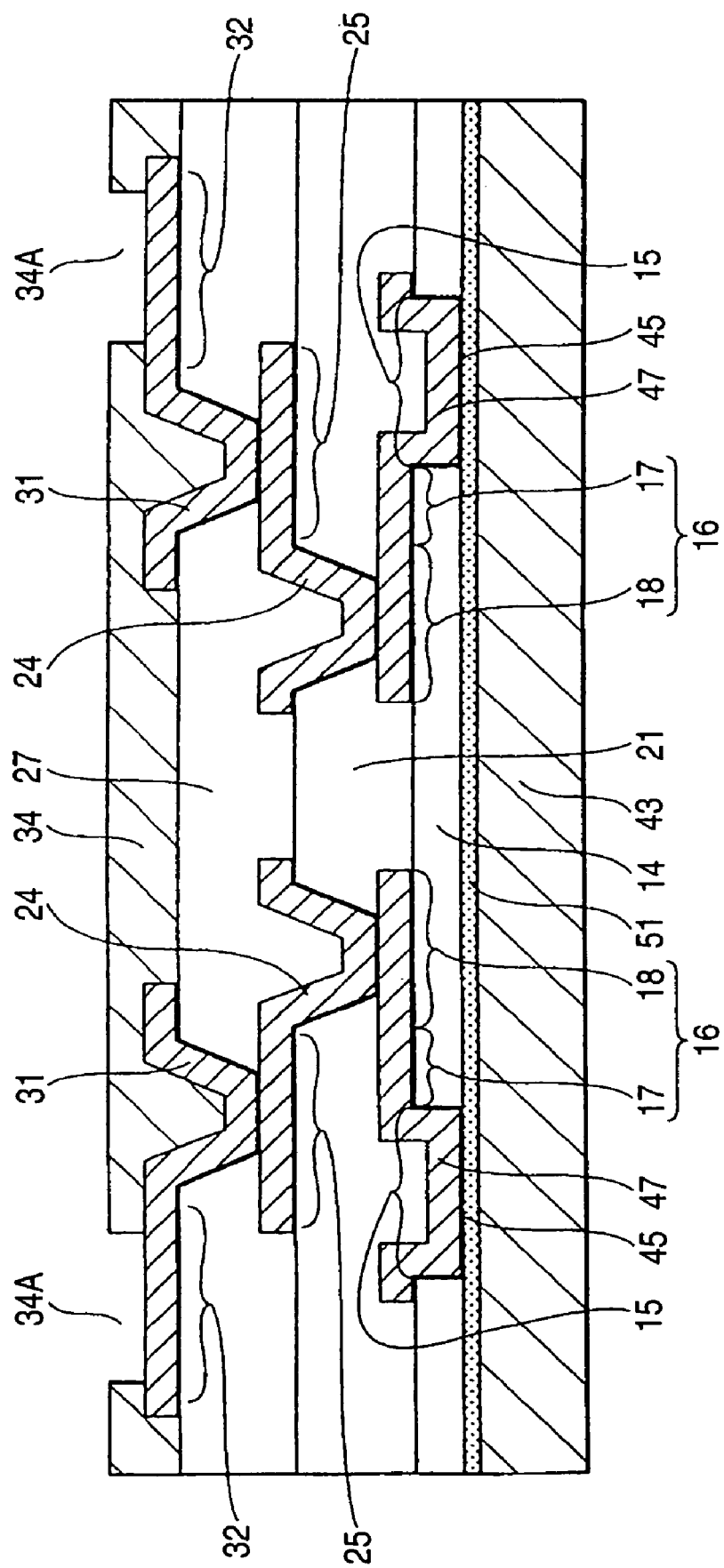
FIG. 22 is a view (second) showing a manufacturing step of the wiring substrate in accordance with the modified example of the first embodiment of the present invention.

Then, in a step shown in FIG. 22, a structure corresponding to the wiring substrate 11 is formed on the metal layer 51 with the same procedure as the steps shown in FIGS. 6 to 16 described previously.

Figure 23:
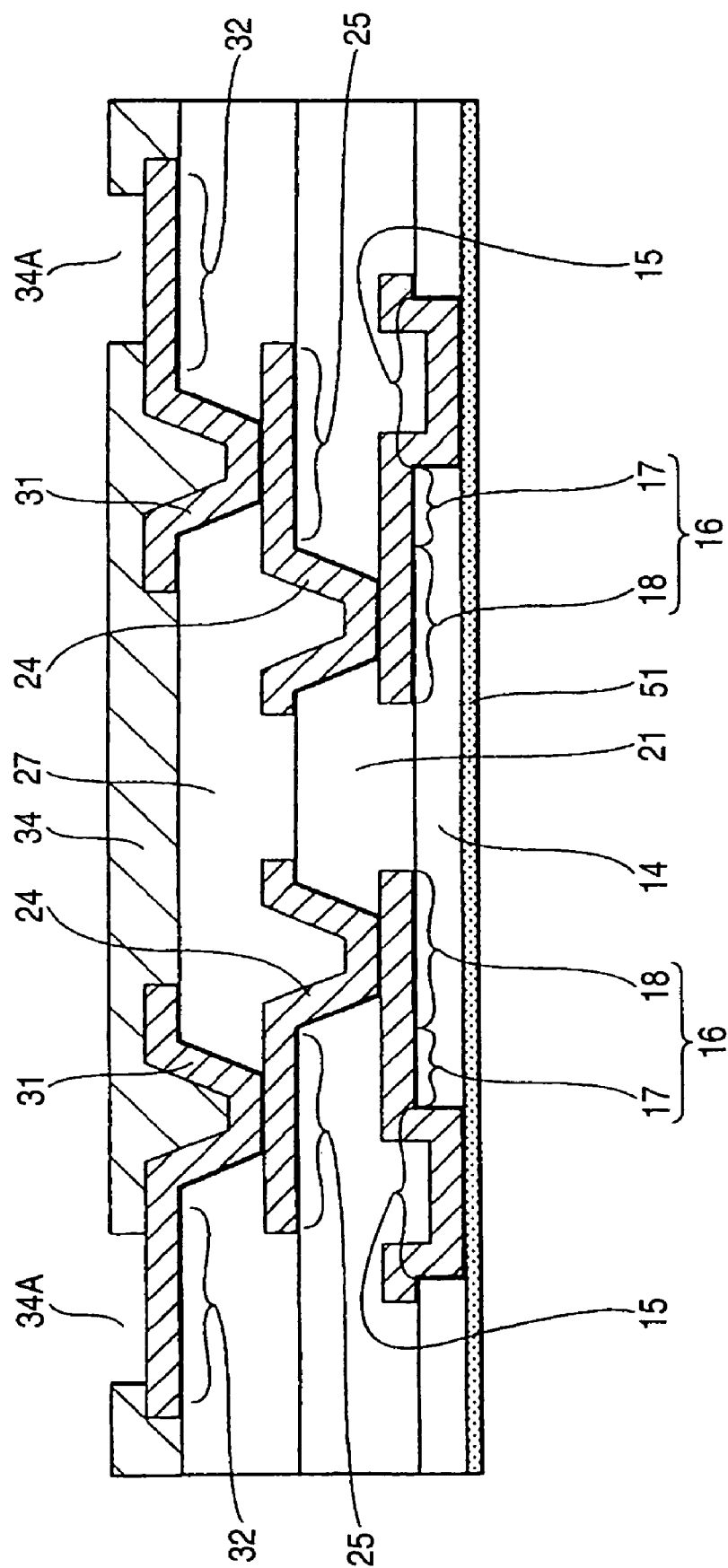
FIG. 23 is a view (third) showing a manufacturing step of the wiring substrate in accordance with the modified example of the first embodiment of the present invention.

Then, in a step shown in FIG. 23, the metal plate 43 is removed by wet etching. As the etchant for use in wet etching, the one with which the metal layer 51 is resistant to etching (the one against which the metal layer 51 serves as an etching stopper) is used.

Thus, the metal layer 51 which is resistant to etching with the etchant for removing the metal plate 43 is formed between the metal plate 43 and the connection terminal 15. This can prevent the connection terminal 15 from being etched for removing the metal plate 43.

Figure 24:
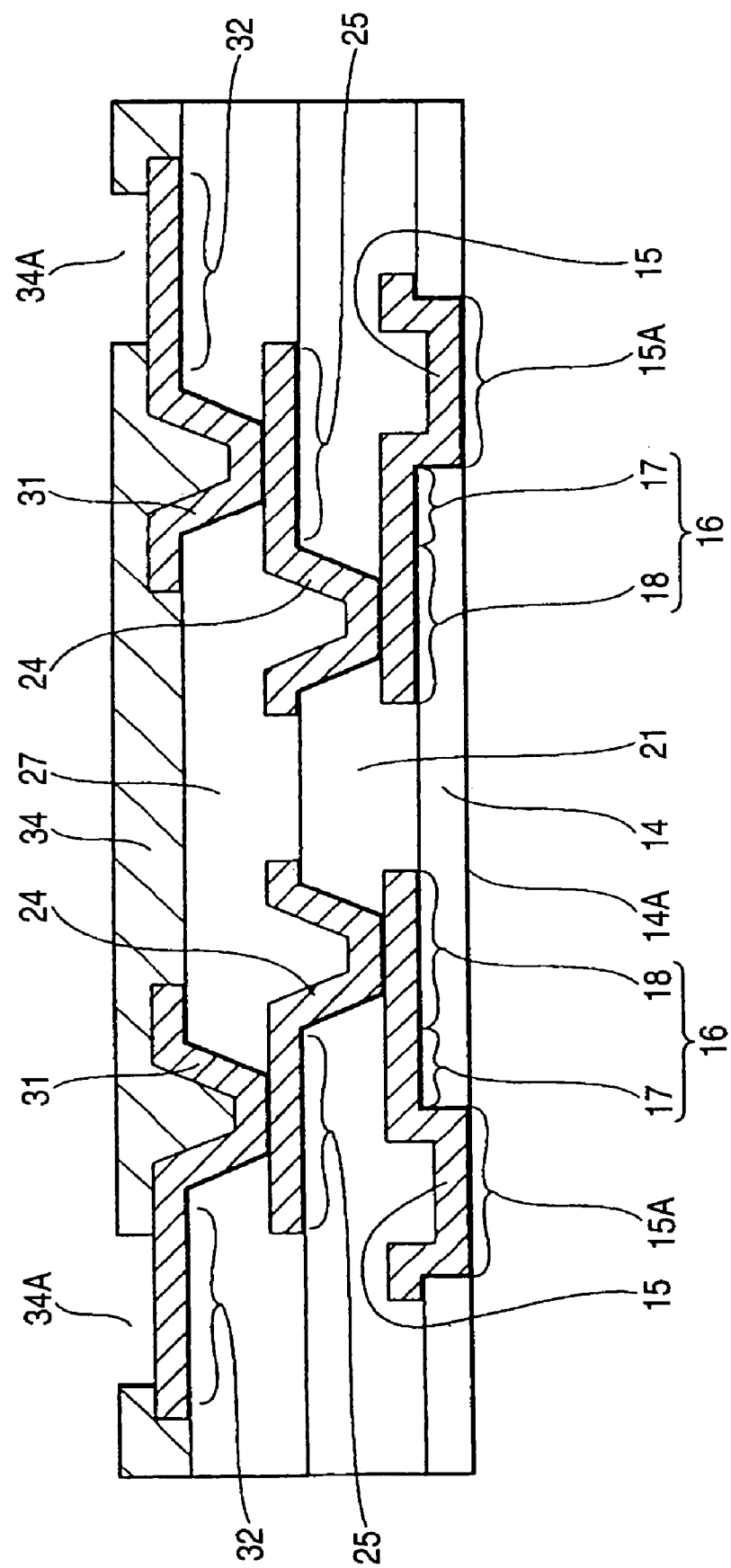
FIG. 24 is a view (fourth) showing a manufacturing step of the wiring substrate in accordance with the modified example of the first embodiment of the present invention.

Then, in a step shown in FIG. 24, the metal layer 51 is removed by wet etching. As a result of this, the wiring substrate 11 is manufactured. Whereas, as the etchant for removing the metal layer 51, the one with which the connection terminal 51 is resistant to etching is used.

Thus, the metal layer 51 is removed by using the etchant with which the connection terminal 15 is resistant to etching. This can prevent the connection terminal 15 from being etched by the etchant.

With the manufacturing method of the wiring substrate in accordance with the modified example of this embodiment, the metal layer 51 which is resistant to etching with the etchant for use in removing the metal plate 43 is formed between the metal plate 43 and the connection terminal 15. This can prevent the connection terminal 15 from being etched in the removing step of the metal plate 43.

Further, the metal layer 51 is removed by using the etchant with which the connection terminal 15 is resistant to etching. This can prevent the connection terminal 15 from being etched for etching the metal layer 51.

Second Embodiment

Figure 25:
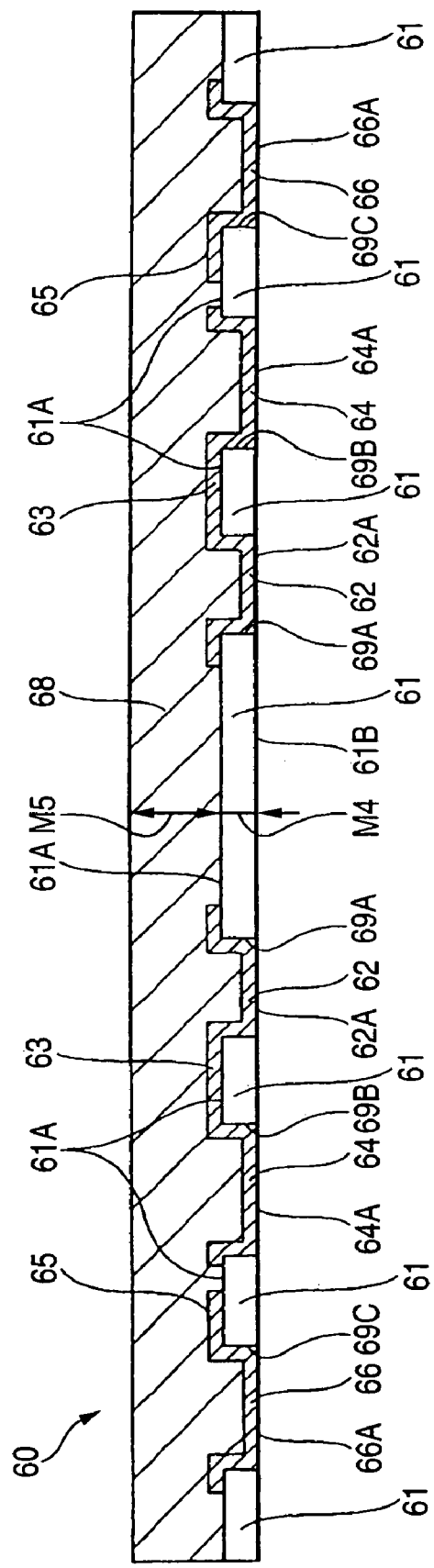
FIG. 25 is a cross sectional view showing a wiring substrate in accordance with a second embodiment of the present invention.
Figure 26:
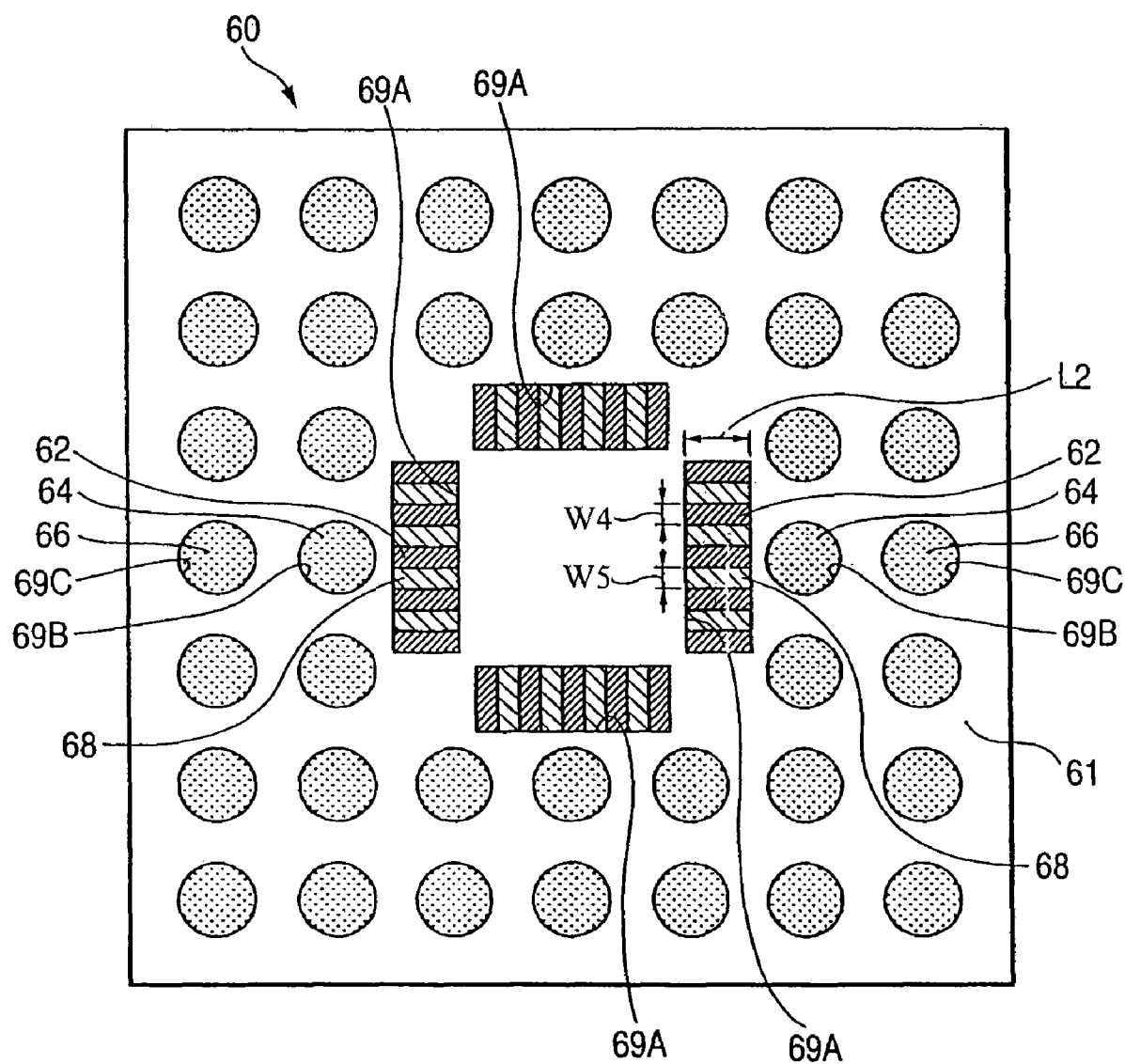
FIG. 26 is a plan view of the wiring substrate in accordance with the second embodiment of the present invention.

FIG. 25 is a cross sectional view of a wiring substrate in accordance with a second embodiment of the present invention. FIG. 26 is a plan view of a wiring substrate in accordance with the second embodiment of the present invention.

By reference to FIG. 25, a wiring substrate 60 of the second embodiment has insulation layers 61 and 68, a connection terminal 62, wires 63 and 65, and external connection terminals 64 and 66.

By reference to FIGS. 25 and 26, the insulation layer 61 has openings 69A to 69C. The opening 69A is formed in such a shape as to be capable of mounting at least two or more connection terminals 62. The openings 69B are disposed outside the opening 69A, and a plurality of the openings 69B are formed in such a manner as to surround the formation region of the opening 69A. The openings 69C are arranged outside the opening 69B, and a plurality of the openings 69C are formed in such a manner as to surround the openings 69B. As the insulation layer 61, for example, a thermosetting resin or a photosensitive resin can be used. The thickness M4 of the insulation layer 61 can be set to be, for example, 5 µm to 10 µm.

The connection terminal 62 is mounted in the opening 69A. To the surface 62A of the connection terminal 62, a semiconductor chip not shown is connected. The surface 62A of the connection terminal 62 is made generally flush with the surface 61B of the insulation layer 61. The width W4 of the connection terminal 62 can be set to be, for example, 20 µm. Whereas, the mounting pitch W5 of the connection terminal 62 can be set to be, for example, 20 µm. The length L2 of the connection terminal 62 can be set to be, for example, 500 µm.

Thus, the surface 62A of the connection terminal 62, on the side thereof to which the semiconductor chip is connected, is made generally flush with the surface 61B of the insulation layer 61. As a result, for example, when the semiconductor chip is flip-chip connected to the connection terminal 62, solder will not leak to the side surface of the connection terminal 62. This prevents a short circuit between the adjacent connection terminals 62 due to the solder. Therefore, it is possible to dispose the connection terminals 62 at a narrow mounting pitch.

Further, the surface 62A of the connection terminal 62, on the side thereof to which the semiconductor chip is connected, is made generally flush with the surface 61B of the insulation layer 61. As a result, for example, when the semiconductor chip is flip-chip connected to the connection terminal 62, it becomes possible to ensure a sufficient clearance between the wiring substrate 60 and the semiconductor chip. Accordingly, it is possible to prevent the occurrence of voids in the underfill resin filling between the wiring substrate 60 and the semiconductor chip.

A wire 63 is disposed on the surface 61A of the insulation layer 61. The one edge of the wire 63 is connected to the connection terminal 62, and the other edge thereof is electrically connected to an external connection terminal 64.

The external connection terminal 64 is disposed in the opening 69B. The external connection terminal 64 is for establishing an electrical connection with a mounting board such as a mother board. The external connection terminal 64 is electrically connected with the connection terminal 62 via the wire 63. The surface 64A of the external connection terminal 64 is made generally flush with the surface 61B of the insulation layer 61. In other words, the external connection terminal 64 is disposed on the same plane as that of the connection terminal 62.

A wire 65 is disposed on the surface 61A of the insulation layer 61. The one edge of the wire 65 is connected to the connection terminal 62, and the other edge thereof is electrically connected to an external connection terminal 66.

The external connection terminal 66 is disposed in the opening 69C. The external connection terminal 66 is for establishing an electrical connection with a mounting board such as a mother board. The external connection terminal 66 is electrically connected with the connection terminal 62 via the wire 65. The surface 66A of the external connection terminal 66 is made generally flush with the surface 61B of the insulation layer 61. In other words, the external connection terminal 66 is disposed on the same plane as that of the connection terminal 62.

Thus, the connection terminal 62 and the external connection terminals 64 and 66 are disposed on the same plane. In addition, the connection terminal 62 and the external connection terminal 64 are electrically connected by the wire 63 disposed on the surface 61A of the insulation layer 61. Whereas, the connection terminal 62 and the external connection terminal 66 are electrically connected by the wire 65 disposed on the surface 61A of the insulation layer 61. As a result, the via for establishing an electrical connection between the external connection terminals 64 and 66 and the connection terminal 62 becomes unnecessary. As a result of this, it becomes possible to make small the width W4 and the mounting pitch W5 of the connection terminals 62. Therefore, it is possible to mount the connection terminals 62 at a narrow pitch.

Whereas, the surface 62A of the connection terminal 62, on the side thereof to which the semiconductor chip is connected, is made generally flush with the surface 61B of the insulation layer 61. As a result, when the semiconductor chip is flip-chip connected to the connection terminal 62, solder will not leak to the side surface of the connection terminal 62. This prevents a short circuit between the adjacent connection terminals 62 due to the solder. Therefore, it is possible to dispose the connection terminals 62 at a narrow mounting pitch.

Further, the surface 62A of the connection terminal 62, on the side thereof to which the semiconductor chip is connected, is made generally flush with the surface 61B of the insulation layer 61. As a result, when the semiconductor chip is flip-chip connected to the connection terminal 62, it becomes possible to ensure a sufficient clearance between the wiring substrate 60 and the semiconductor chip. Accordingly, it is possible to prevent the occurrence of voids in the underfill resin filling between the wiring substrate 60 and the semiconductor chip.

The insulation layer 68 is disposed on the surface 61A side of the insulation layer 61 in such a manner as to cover the connection terminals 62, the wires 63 and 65, and the external connection terminals 64 and 66. The insulation layer 68 performs a function of a reinforcing plate for reinforcing the strength of the wiring substrate 60. As the insulation layer 68, for example, a resin containing a reinforcing material such as glass cloth may be used. Specifically, as the insulation layer 68, for example, a prepreg resin can be used. The thickness M5 of the insulation layer 68 can be set to be, for example, 50 μm to 200 μm.

With the wiring substrate of this embodiment, the connection terminals 62 and the external connection terminals 64 and 66 are disposed on the same plane. In addition, the connection terminal 62 and the external connection terminal 64 are electrically connected by the wire 63 disposed on the surface 61A of the insulation layer 61. Whereas, the connection terminal 62 and the external connection terminal 66 are electrically connected by the wire 65 disposed on the surface 61A of the insulation layer 61. As a result, the via for establishing an electrical connection between the external connection terminals 64 and 66 and the connection terminal 62 becomes unnecessary. As a result of this, it becomes possible to make small the width W4 and the mounting pitch W5 of the connection terminals 62. Therefore, it is possible to mount the connection terminals 62 at a narrow pitch.

Figure 27:
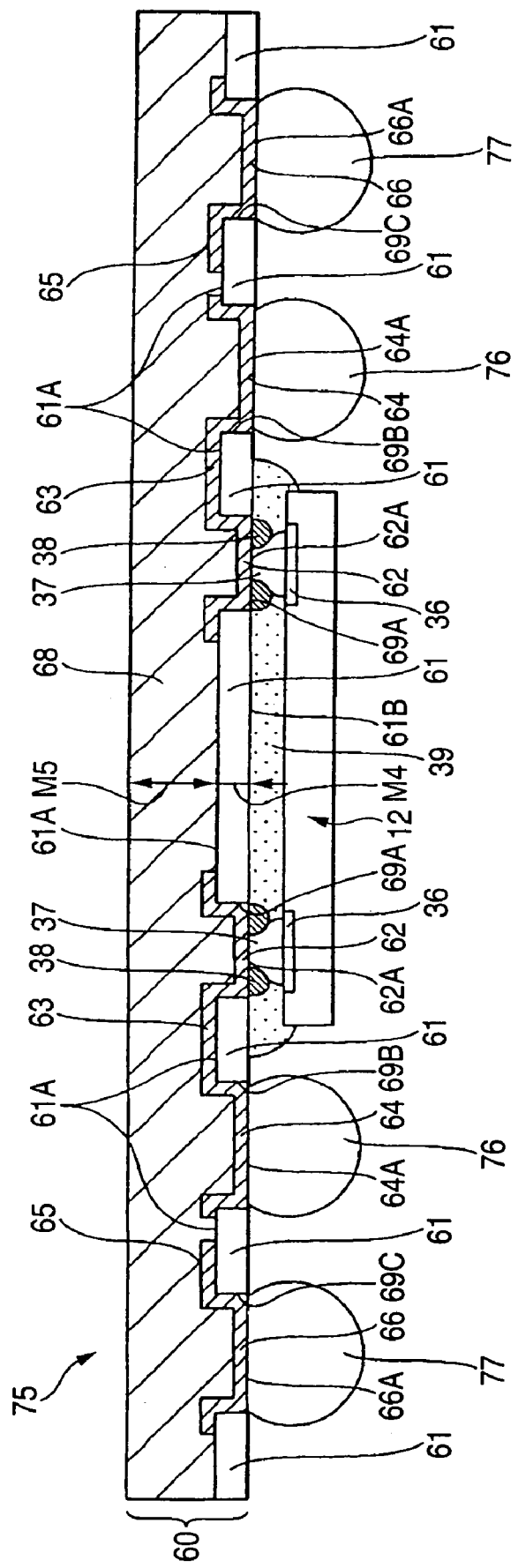
FIG. 27 is a cross sectional view of a semiconductor device in accordance with the second embodiment of the present invention.

FIG. 27 is a cross sectional view of a semiconductor device in accordance with the second embodiment of the present invention. In FIG. 27, the same constitutional elements as those of the semiconductor device 10 of the first embodiment are given the same reference numerals and signs.

By reference to FIG. 27, a semiconductor device 75 of the second embodiment has a wiring substrate 60, a semiconductor chip 12, and solder balls 76 and 77. The semiconductor chip 12 is flip-chip connected to the connection terminal 62. The solder ball 76 is disposed on an external connection terminal 64. The solder ball 77 is disposed on an external connection terminal 66. The external connection terminals 64 and 66 are electrically connected with a mother board not shown via the solder balls 76 and 77, respectively.

Up to this point, the preferred embodiments of the present invention were described in details. However, the present invention is not limited to such specific embodiments, and various modifications/changes are possible within the scope of the gist of the present invention described in the appended claims.

The present invention is applicable to a wiring substrate including a connection terminal to be electrically connected with a semiconductor chip, and a manufacturing method thereof, and a semiconductor device.

What is claimed is:
1. A wiring substrate comprising:
a first insulation layer;
a connection terminal disposed in the first insulation layer so as to be exposed from a first main surface of the first insulation layer and to be electrically connected with a semiconductor chip;
a second insulation layer disposed on a second main surface of the first insulation layer situated on the opposite side from the first main surface;
a via disposed in the second insulation layer and separated from the connection terminal; and
a wiring pattern that is directly connected to the connection terminal and is disposed on the second main surface of the first insulation layer and electrically connecting the connection terminal and the via,
wherein
a plurality of the connection terminals are disposed in an opening formed in the first insulation layer,
a surface of the connection terminal is exposed from the first main surface of the first insulation layer so that the surface of the connection terminal is made generally flush with the first main surface of the first insulation layer,
the connection terminal and the wiring pattern are integrally formed such that the wiring pattern extends from the connection terminal, and the opening has a size sufficient to allow a space between adjacent connection terminals in the opening so that the second insulation layer is exposed through the first main surface of the first insulation layer in the space of the opening.

2. The wiring substrate according to claim 1, wherein the wiring pattern has a via connection part formed in a shape having a larger width than the width of the connection terminal.

3. The wiring substrate according to claim 1, wherein
the connection terminal and the wiring pattern are integrally formed such that the wiring pattern extends from the connection terminal over from the opening to the second main surface of the first insulation layer.

4. The wiring substrate according to claim 1, wherein the plurality of the connection terminals are disposed in the opening formed in the first insulation layer such that portions of the second insulation layer are exposed at locations between the connection terminals.

5. A semiconductor device, comprising:
a wiring substrate having a first insulation layer, a connection terminal disposed in the first insulation layer and generally flush with a first main surface of the first insulation layer, a second insulation layer disposed on a second main surface of the first insulation layer situated on the opposite side from the first main surface, a via disposed in the second insulation layer and separated from the connection terminal, and a wiring pattern that is directly connected to the connection terminal and is disposed on the second main surface of the first insulation layer and electrically connecting the connection terminal and the via;
a semiconductor chip flip-chip connected to the connection terminal; and
an underfill resin disposed between the semiconductor chip and the wiring substrate,
wherein
a plurality of the connection terminals are disposed in an opening formed in the first insulation layer,
a surface of the connection terminal is exposed from the first main surface of the first insulation layer so that the surface of the connection terminal is made generally flush with the first main surface of the first insulation layer,
the connection terminal and the wiring pattern are integrally formed such that the wiring pattern extends from the connection terminal, and
the opening has a size sufficient to allow a space between adjacent connection terminals in the opening so that the second insulation layer is exposed through the first main surface of the first insulation layer in the space of the opening.

6. The semiconductor device according to claim 5, wherein the wiring pattern has a via connection part formed in a shape having a larger width than the width of the connection terminal.

7. The semiconductor device according to claim 5, wherein the plurality of the connection terminals are disposed in the opening formed in the first insulation layer such that portions of the second insulation layer are exposed at locations between the connection terminals.

8. A method for manufacturing a wiring substrate, the method comprising steps of:
forming a first insulation layer on a support substrate;
forming an opening in the first insulation layer;
forming a connection terminal and a wiring pattern integrally such that the connection terminal is disposed in the opening formed in the first insulation layer and the wiring pattern extends from the connection terminal over from the opening to a second main surface of the first insulation layer, the second main surface being situated on the opposite side from a first main surface on which the support substrate is provided;
forming a second insulating layer on the second main surface of the first insulating layer;
forming a via in the second insulating layer such that the via is separated from the connection terminal and the via is electrically connected with the connection terminal via the wiring pattern; and
removing the support substrate,
wherein
in the connection terminal and the wiring pattern forming step, a plurality of the connection terminals are formed so as to be disposed in the opening formed in the first insulation layer,
a surface of the connection terminal is exposed from the first main surface of the first insulation layer so that the surface of the connection terminal is made generally flush with the first main surface of the first insulation layer,
the connection terminal and the wiring pattern are integrally formed such that the wiring pattern extends from the connection terminal, and
the opening has a size sufficient to allow a space between adjacent connection terminals in the opening so that the second insulation layer is exposed through the first main surface of the first insulation layer in the space of the opening.

9. The method for manufacturing a wiring substrate according to claim 8, wherein the plurality of the connection terminals are disposed in the opening formed in the first insulation layer such that portions of the second insulation layer are exposed at locations between the connection terminals.

* * * * *